United States Patent
Furukawa et al.

(10) Patent No.: US 6,228,697 B1
(45) Date of Patent: May 8, 2001

(54) METHOD OF MANUFACTURING SEMICONDUCTOR DEVICE INCLUDING FIELD EFFECT TRANSISTORS

(75) Inventors: Akihiko Furukawa; Yoshikazu Yoneda, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/158,602

(22) Filed: Sep. 23, 1998

(30) Foreign Application Priority Data

Apr. 2, 1998 (JP) .................................................. 10-089770

(51) Int. Cl.[7] ..................... H01L 21/8238; H01L 21/8242
(52) U.S. Cl. .......................... 438/228; 438/241; 438/217; 438/207; 438/202
(58) Field of Search ..................................... 438/241, 258, 438/197, 199, 289, 291, 200, 202, 207, 204, 217, 194, 231, 228

(56) References Cited

U.S. PATENT DOCUMENTS

| 5,023,191 | * | 6/1991 | Sakurai | 438/527 |
| 5,340,756 | * | 8/1994 | Nagayasu | 438/200 |
| 5,502,009 | | 3/1996 | Lin . | |
| 5,796,139 | * | 8/1998 | Fukase | 257/315 |
| 5,905,284 | * | 5/1999 | Fujii et al. | 257/335 |

FOREIGN PATENT DOCUMENTS 2-129968    5/1990 (JP) .

OTHER PUBLICATIONS

"Silicon Processing for the VLSI Era", vol. 2–Process Integration, S. Wolf.

* cited by examiner

Primary Examiner—Charles Bowers
Assistant Examiner—Brook Kebede
(74) Attorney, Agent, or Firm—McDermott, Will & Emery

(57) ABSTRACT

A method of manufacturing a semiconductor device is provided in which a semiconductor device including a plurality of FETs having different threshold voltages and gate insulating films with different film thicknesses can be manufactured in a simplified process. Specifically, a first gate insulating film is formed on the main surface of a semiconductor substrate. On the first gate insulating film, a first protection film is formed. In regions A and B in each of which an FET having a second gate insulating film with a film thickness different from that of the first gate insulating film is to be formed, the first gate insulating film and the first protection film are removed to expose the surface of the semiconductor substrate. At the same time, the first protection film is left in regions other than the regions A and B. Using the first protection film as a mask, an impurity is implanted into the semiconductor substrate in the regions A and B.

6 Claims, 24 Drawing Sheets

METHOD OF MANUFACTURING SEMICONDUCTOR DEVICE INCLUDING FIELD EFFECT TRANSISTORS

BACKGROUND OF THE INVENTION

1. Field of the Invention

The present invention relates to a method of manufacturing a semiconductor device, and more particularly to a method of manufacturing a semiconductor device including field effect transistors.

2. Description of the Background Art

Recently, there has been an increasing demand for a semiconductor device, in particular a Dynamic Random Access Memory (DRAM), which can operate at higher speed. To accomplish such a fast-operating DRAM, it is essential to improve the performance including the operational speed, for example, of a field effect transistor (FET) located in the peripheral circuit region of the DRAM performing data transmission and the like. Effective ways to improve such performance of the FET include: making its gate insulating film thinner, reducing the threshold voltage, and shortening the gate length.

For making a thinner gate insulating film as described above, which directly contributes to the improvement of performance of the FET, attempts have been made to obtain a gate insulating film with a thickness of 3 to 4 nm. However, in the same DRAM, there exists another FET to which a high voltage is to be applied. In particular, a relatively high voltage is applied to an FET in a memory cell region. If a gate insulating film of such FET is made thinner as stated above, there may arise problems such as an increased leakage current and a decreased breakdown voltage.

Therefore, the film thickness of a gate insulating film of the FET in the memory cell region to which a relatively high voltage is to be applied cannot be made thinner as that in the peripheral circuit region. It is thus needed to form gate insulating films of different film thicknesses on a single semiconductor substrate.

By reducing the threshold voltage, which is already mentioned above as another approach to the improved performance of an FET, a large ON-state current can be obtained in the FET even with a low voltage. On the other hand, however, due to such reduction in the threshold voltage, the leakage current will abruptly increase when the FET is turned off. As a result, power consumption of the DRAM will increase.

Accordingly, there has been generally employed a method in which an FET having a first, low threshold voltage and another FET having a second threshold voltage 0.2 to 0.4V higher than the first one are formed, so that the leakage current generated at an FET having the first, low threshold voltage is cut off employing an FET having the second, relatively higher threshold voltage.

Thus, in the peripheral circuit region of the DRAM, it is required to form a plurality of FETs having different threshold voltages. Herein, the threshold voltages of the FETs are generally adjusted by introducing impurities into a semiconductor substrate.

As described above, in a DRAM, or a semiconductor device for which a high-speed operation is highly demanded, it is necessary to form, on a single semiconductor substrate, a plurality of FETs having gate insulating films of different film thicknesses and different threshold voltages, respectively.

For manufacturing a semiconductor device including such a plurality of FETs in which film thicknesses of the gate insulating films as well as the threshold voltages are different from one another as described above, the following manufacturing process has been employed.

Referring to FIG. 24, a field oxide film 102 and an oxide film 103 are first formed on the main surface of a semiconductor substrate 101. At this time, a first resist pattern is formed for the formation of field oxide film 102.

Next, an n type impurity is introduced into a prescribed region in semiconductor substrate 101 to form an n type well 107 and n type impurity regions 130a–130c. Here, a second resist pattern is formed to be used as a mask when introducing the n type impurity.

A p type impurity is then introduced into a prescribed region of the main surface of semiconductor substrate 101 to form a p type well 110 and p type impurity regions 131a–131c. Here, a third resist pattern is formed to be used as a mask when introducing the p type impurity.

Thereafter, the p type impurity is additionally introduced into the main surface of semiconductor substrate 101 located in a memory cell region for adjusting the threshold voltage of an FET therein. Accordingly, a p type impurity region 127 of high concentration is formed. At this time, a fourth resist pattern is formed and used as a mask when additionally introducing the p type impurity.

Still referring to FIG. 24, for adjusting the threshold voltage of an FET in the peripheral circuit region, a p type impurity 113 is introduced into semiconductor substrate 101, and thus a second p type impurity region 114 of high concentration is formed. For using as a mask when the p type impurity 113 is introduced, a fifth resist pattern 104 is formed.

In this way, impurity concentration at respective regions in semiconductor substrate 101 is adjusted so as to adjust the threshold voltages of respective FETs.

Thereafter, a plurality of FETs including gate insulating films of different film thicknesses are formed in prescribed regions of semiconductor substrate 101. Specifically, following the steps as described above, oxide film 103 is first removed from the main surface of semiconductor substrate 101.

Next, with reference to FIG. 25, on the main surface of semiconductor substrate 101, an oxide film 111 is formed, which is to be a gate insulating film having a first film thickness. A polycrystalline silicon (polysilicon) film 112 is formed on oxide film 111.

Thereafter, a sixth resist pattern (not shown) is formed on polysilicon film 112. Using this resist pattern as a mask, oxide film 111 and polysilicon film 112 are etched away in regions A and B. The resist pattern is then removed. As a result, the structure shown in FIG. 25 is obtained.

Thereafter, on the main surface of semiconductor substrate 101 in regions A and B as well as on polysilicon film 112, an oxide film (not shown) is formed to be a gate insulating film having a second film thickness. A second polysilicon film (not shown) is also formed on this oxide film.

Next, in regions A and B, a seventh resist pattern is formed on the second polysilicon film. Using this resist pattern as a mask, the second polysilicon film and the oxide film located in regions other than the regions A and B are etched away. The resist pattern is then removed.

Next, after depositing a conductive film over the entire surface, an eighth resist pattern is formed and is used as a mask for etching to form a gate insulating film and a gate electrode.

An impurity is then introduced into semiconductor substrate 101 to form source/drain regions of each FET.

There has thus been formed a semiconductor device including a plurality of FETs having gate insulating films of different film thicknesses and different threshold voltages.

In the manufacturing process as described above, the formation and removal of resist patterns need to be repeated eight times before completing the formation of gate electrodes and gate insulating films, and therefore, the number of manufacturing steps is substantially increased in comparison with those for a conventional semiconductor device. Such increase of the number of manufacturing steps has caused increase in manufacturing cost.

SUMMARY OF THE INVENTION

An object of the present invention is to provide a method of manufacturing a semiconductor device including a plurality of FETs with different threshold voltages and gate insulating films of different thicknesses in a process more simplified than in a conventional method.

In the method of manufacturing a semiconductor device according to one aspect of the present invention, a first gate insulating film is formed on a semiconductor substrate having regions in which first and second FETs are to be formed respectively. Formed on the first gate insulating film is a first protection film. In the region in which the second FET is to be formed, the first gate insulating film and the first protection film are removed to expose the surface of the semiconductor substrate, while the first protection film is left in the region in which the first FET is to be formed. Using the first protection film as a mask, an impurity is introduced into the semiconductor substrate in the region in which the second FET is to be formed.

As described above, the first protection film is used as a mask when introducing an impurity into the semiconductor substrate in the second FET forming region, and therefore, the otherwise needed step for forming a resist pattern becomes unnecessary. As a result, the manufacturing process for a semiconductor device can be simplified compared to a conventional one.

In the method of manufacturing a semiconductor device according to this aspect, the step of forming the first protection film may be a step of forming a first conductive film.

In this case, the first conductive film serving as the first protection film can be utilized as a part of a gate electrode located on the first gate insulating film. Therefore, when forming a gate electrode on the first gate insulating film, a step of removing the first protection film from above the first gate insulating film becomes unnecessary. As a result, the manufacturing process for a semiconductor device can be simplified.

In the manufacturing method according to this aspect, the step of manufacturing the first conductive film may also be a step of forming a polysilicon film.

In the manufacturing method of a semiconductor device according to the same aspect, a second gate insulating film may be formed on the semiconductor substrate in the second FET forming region, and on the second gate insulating film, a second protection film may be formed. In addition, in the first FET forming region, the first gate insulating film and the first protection film may be removed to expose the surface of the semiconductor substrate, while in the second FET forming region, the second protection film may be left, and using the second protection film as a mask, an impurity may be introduced into the semiconductor substrate in the first FET forming region.

Since the second protection film is used as a mask when introducing an impurity into the semiconductor substrate in the first FET forming region, a conventional step of forming a resist pattern is no longer needed. Therefore, a simplified manufacturing process for a semiconductor device can be realized.

In the method of manufacturing a semiconductor device according to the same aspect, the second FET forming region may include regions in which third and fourth FETs are to be formed respectively. In the second FET forming region, a second gate insulating film may be formed on the semiconductor substrate, and a second protection film may also be formed on the second gate insulating film. In the third FET forming region, the second gate insulating film and the second protection film may be removed to expose the surface of the semiconductor substrate, whereas in the fourth FET forming region, the second protection film may be kept for use as a mask when introducing an impurity into the semiconductor substrate in the third FET forming region.

Accordingly, with the second protection film being used as a mask, a conventionally required step of forming a resist pattern when an impurity is introduced into the semiconductor substrate in the third FET forming region. can be eliminated. As a result, the manufacturing process for a semiconductor device is simplified in comparison with a conventional one.

In the manufacturing method for a semiconductor device according to this aspect, the step of forming the second protection film may be a step of forming a second conductive film.

In this case, the second conductive film serving as the second protection film may be utilized as a part of the gate electrode located on the second gate insulating film. Therefore, when forming the gate electrode on the second gate insulating film, the step of removing the second protection film from above the second gate insulating film becomes unnecessary. As a result, the manufacturing process for a semiconductor device can be simplified.

In the same manufacturing method, the step of forming the second conductive film may also be a step of forming a polysilicon film.

In the method for manufacturing a semiconductor device according to the same aspect, the step of introducing an impurity into the semiconductor substrate includes a step of forming an impurity region in the vicinity of the surface of the semiconductor substrate.

Thus, the impurity concentration in the vicinity of the surface of the semiconductor substrate can be changed, and therefore, the impurity concentration at the channel region of an FET formed on the surface of the semiconductor substrate can be adjusted. As a result, the threshold voltage of an FET can readily be modified.

In the manufacturing method of a semiconductor device according to this aspect, the step of introducing an impurity into the semiconductor substrate may include ion implantation, which may be performed at the acceleration voltage of impurity ions of at least 5 keV, but less than 20 keV.

Since the acceleration voltage of impurity ions is relatively low as above, the implantation depth of the impurity ions into the semiconductor substrate can be made small, which enables the impurity concentration at the channel region of an FET formed on the surface of the semiconductor substrate to be adjusted more effectively. As a result, the threshold voltage of the FET can readily be modified.

When performing ion implantation in the step of introducing an impurity into the semiconductor substrate according to this aspect, the acceleration voltage of impurity ions may be at least 20 keV and at most 50 keV.

In this case, an impurity region can be formed deeper from the surface of the semiconductor substrate than in the case of ion implanting at the acceleration voltage less than 20 keV. Assume that an impurity of the first conductivity type is simultaneously introduced into the respective regions in which FETs of the first and the second conductivity types are to be formed. Even in that case, concentration of the impurity of the first conductivity type in the close vicinity of the surface of the semiconductor substrate can be prevented from increasing. As a result, the threshold voltage of the second conductivity type FET to be formed in the region with the impurity of the first conductivity type introduced therein can be prevented from unnecessarily increasing.

In addition, among the regions in which the first conductivity type impurity has been introduced, in the region in which an FET of the first conductivity type is to be formed, the introduced impurity of the first conductivity type cancels the impurity of the second conductivity type existing within the semiconductor substrate. This leads to decrease in the effective concentration of the impurity of the second conductivity type in the above-mentioned region. As a result, the threshold voltage of an FET of the first conductivity type can be decreased to some extent.

In the manufacturing method according to this aspect, an impurity may be boron.

In this manufacturing method according to the same aspect, the step of introducing an impurity into the semiconductor substrate may be a step of forming an impurity region within the semiconductor substrate at a depth between 0.2 µm and 0.4 µm from the surface of the semiconductor substrate.

In this case, assume that an FET of a certain conductivity type is to be formed in the region into which the impurity of the opposite conductivity type has been introduced. Here, the depletion layer surrounding the source or drain region of the FET can largely be prevented from spreading to other semiconductor substrate regions. This is because this impurity region is located in a boundary region between the source/drain region of the FET and one of the other semiconductor substrate regions. As a result, the distance between the source or drain region and other elements formed at the semiconductor substrate region can be reduced than otherwise. Consequently, simplification of the manufacturing step of the semiconductor device as well as higher integration of the semiconductor device can be realized.

In the manufacturing method for the semiconductor device according to the same aspect, ion implantation can be used for the step of introducing an impurity into the semiconductor substrate, in which the acceleration voltage of the impurity ions may be between 100 keV and 400 keV.

The impurity region can thus be readily formed in a region within the semiconductor substrate at a depth between 0.2 µm and 0.4 µm from the surface of the semiconductor substrate.

In the method for manufacturing a semiconductor device according to this aspect, the semiconductor device may be a semiconductor memory device. The first and the second FETs may be formed in the peripheral circuit region of the semiconductor memory device.

Since the first and the second FETs can be more densely integrated in the peripheral circuit region of the semiconductor memory device, in which the circuit integration is highly demanded in particular, the method according to the present invention has a significant effect on such a large scale integration of a semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, the embodiments of the present invention will be described with reference to the drawings.

First Embodiment

Referring to FIGS. 1 to 9 and 12 to 16, a manufacturing process for a semiconductor memory device according to the first embodiment of the present invention will now be described.

Figure 1:
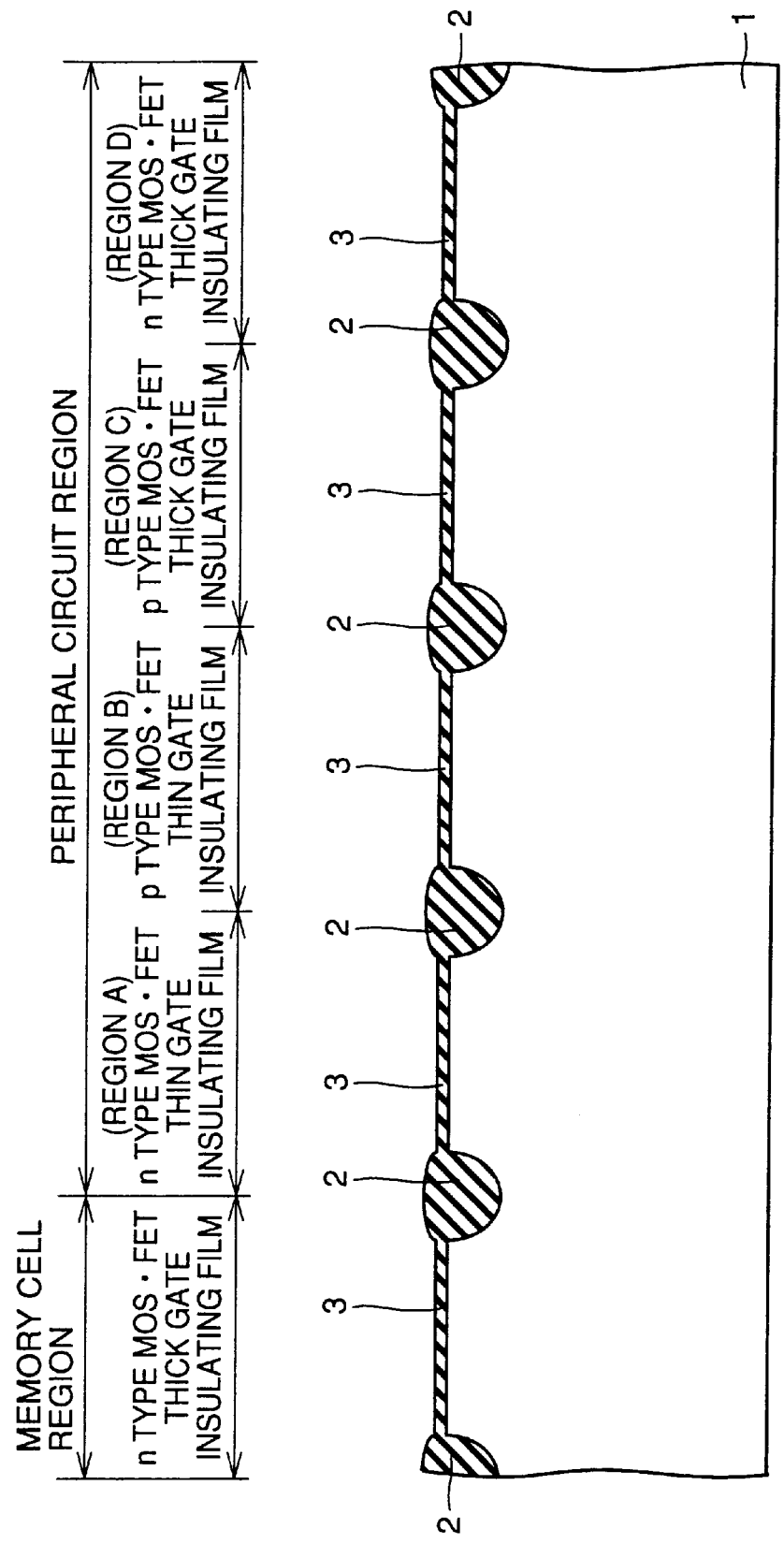
FIGS. 1 to 8 are cross sectional views illustrating the first to eighth steps in the process of manufacturing a semiconductor device according to a first embodiment of the present invention.

Firstly, as shown in FIG. 1, a field oxide film 2 is formed on the main surface of a semiconductor substrate 1 to separate element formation regions. A silicon oxide film 3 is then formed with a film thickness of about 10 nm on the main surface of semiconductor substrate 1 in the element formation region.

Figure 2:
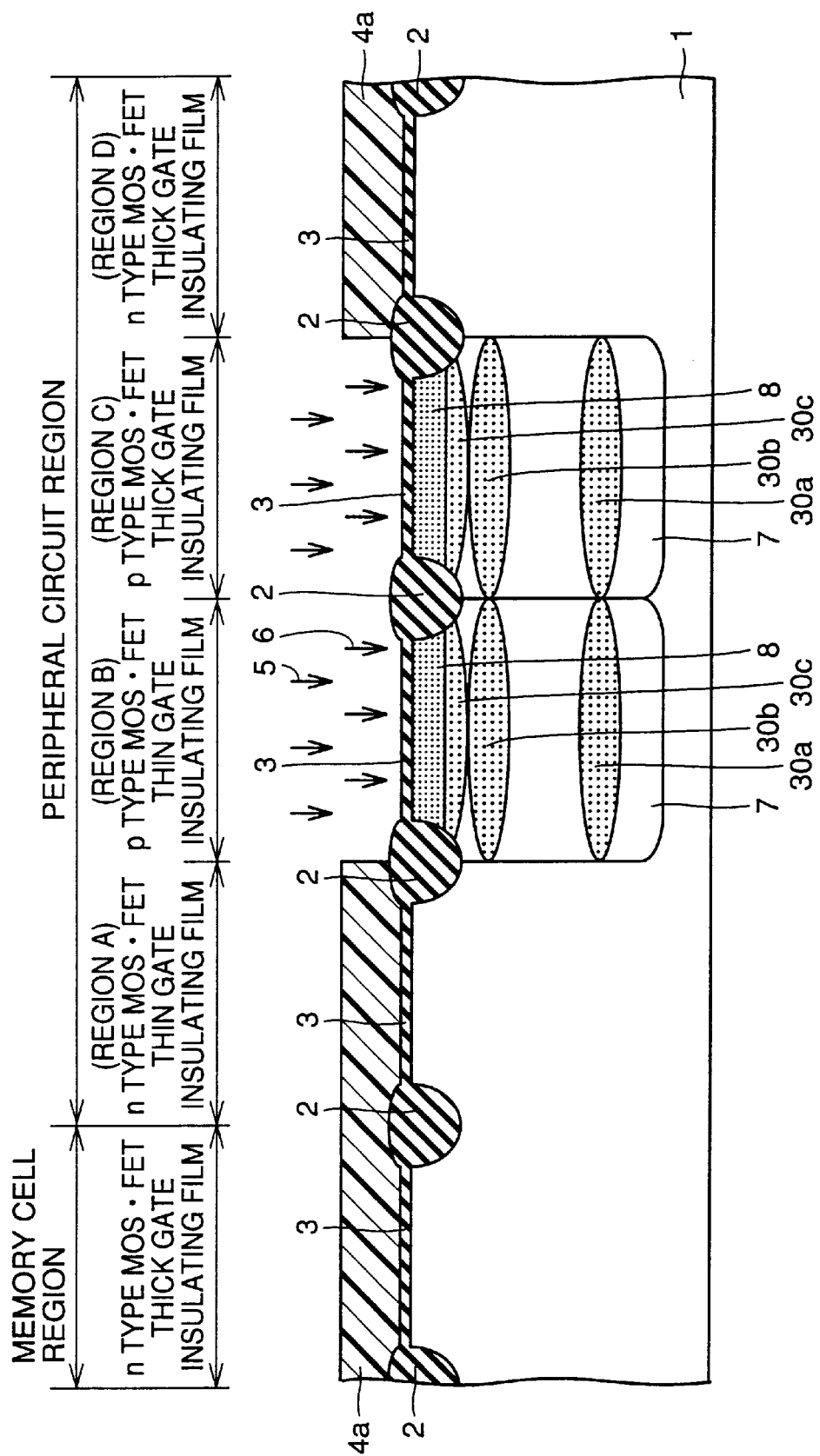

Next, as shown in FIG. 2, a resist pattern 4a is formed on silicon oxide film 3 and field oxide film 2 in regions other than the regions B and C, in which p type FETs are to be formed. In regions B and C, an n type impurity 5, such as phosphorus or arsenic, is implanted into semiconductor substrate 1 using ion implantation at various implanting energy. An n type well 7 and n type impurity regions 30a–30c are thus formed.

In regions B and C, a p type impurity 6, such as boron or $BF_2$, is further implanted into semiconductor substrate 1 at relatively low energy to form a first p type impurity buried region 8. By implanting the p type impurity 6, the threshold voltage of p type FETs formed in regions B and C is set at 0.4 to 0.8V. Resist pattern 4a is then removed.

Figure 3:
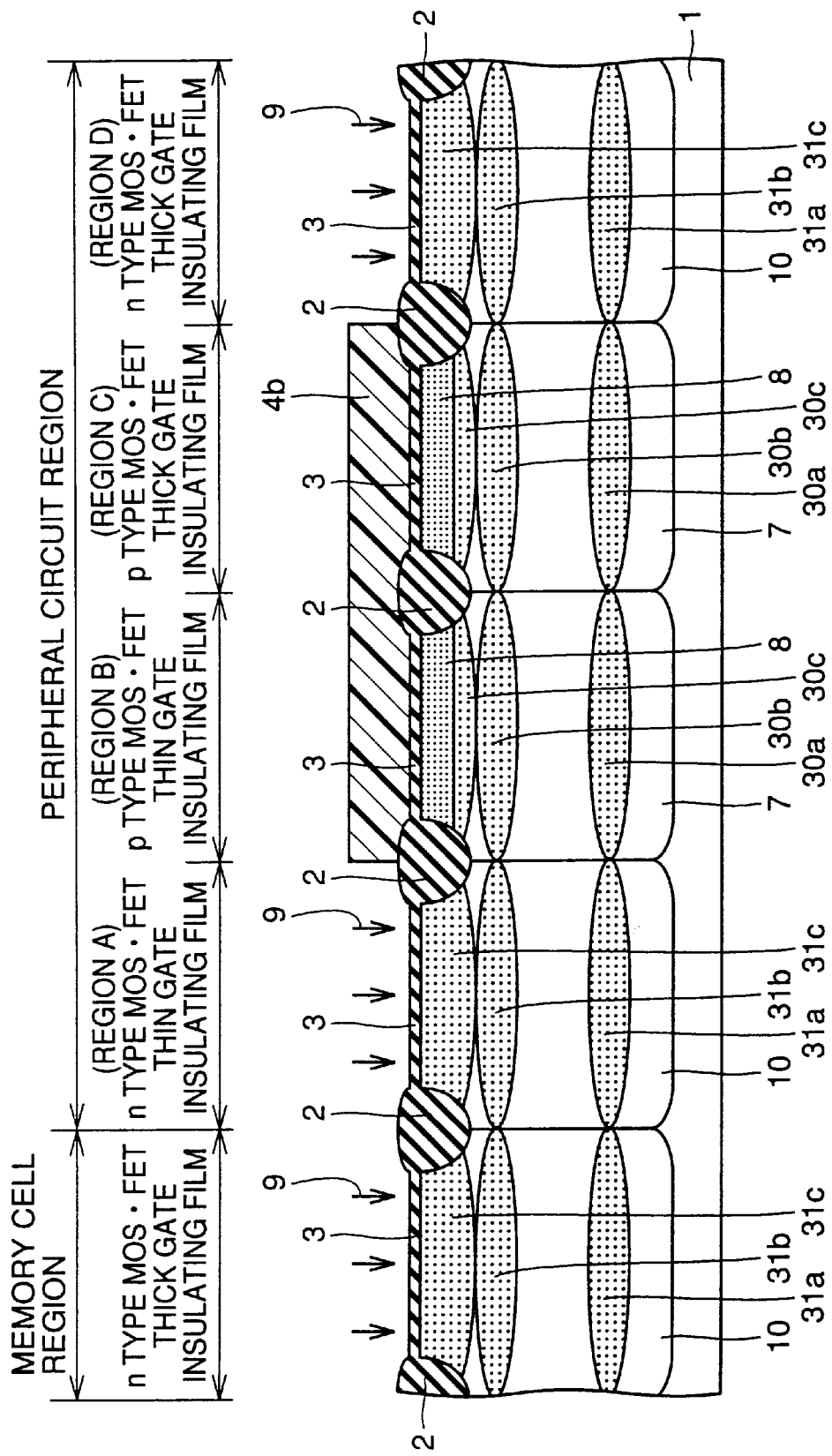

Thereafter, as shown in FIG. 3, a resist pattern 4b is formed on field oxide film 2 and silicon oxide film 3 in regions B and C. A p type impurity 9 is then implanted into semiconductor substrate 1 by ion implantation using various implanting energy to form a p type well 10 and p type impurity regions 31a–31c. Thereafter, resist pattern 4b is removed.

Figure 4:
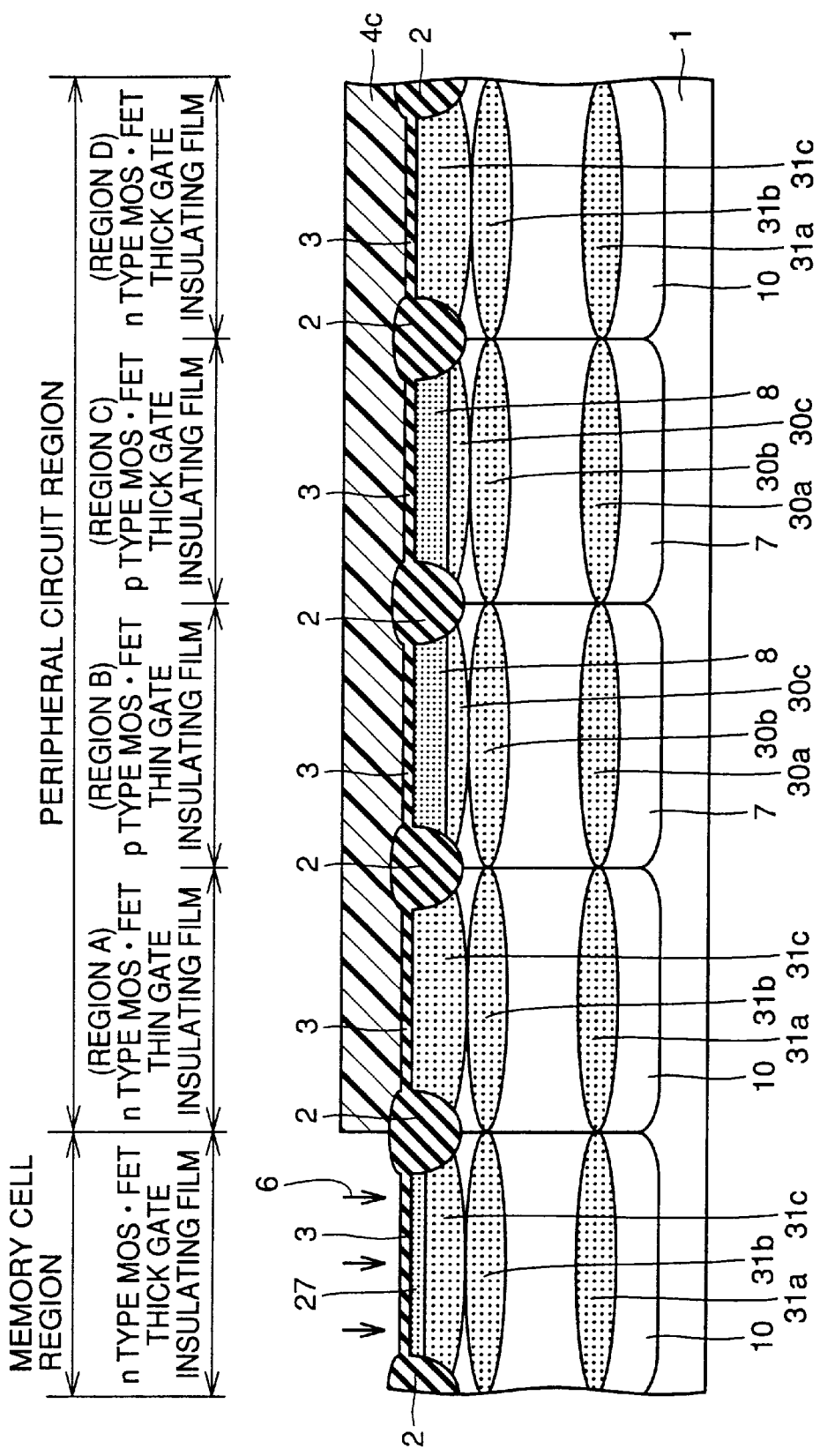

As shown in FIG. 4, in the peripheral circuit region, a resist pattern 4c is formed on field oxide film 2 and silicon oxide film 3. For example, in the memory cell region, p type impurity 6 is additionally implanted into semiconductor substrate 1 in a region in which an n type FET is to be formed. Accordingly, a p type impurity region 27 of high concentration is formed, which allows the threshold voltage of the n type FET in the memory cell region to be further increased. Resist pattern 4c is then removed.

Figure 5:
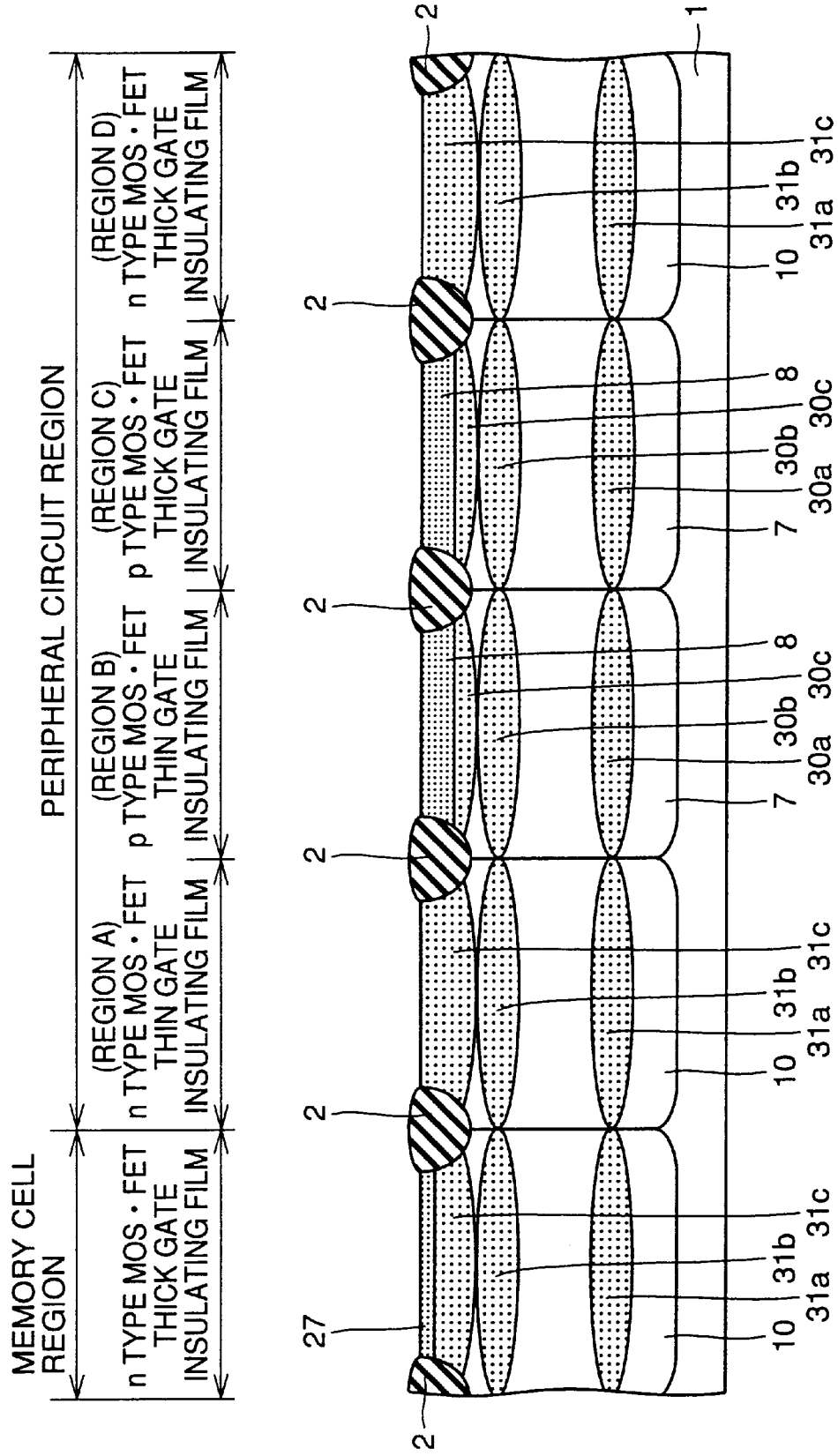

Next, silicon oxide film 3 is removed from the main surface of semiconductor substrate 1 as shown in FIG. 5.

Figure 6:
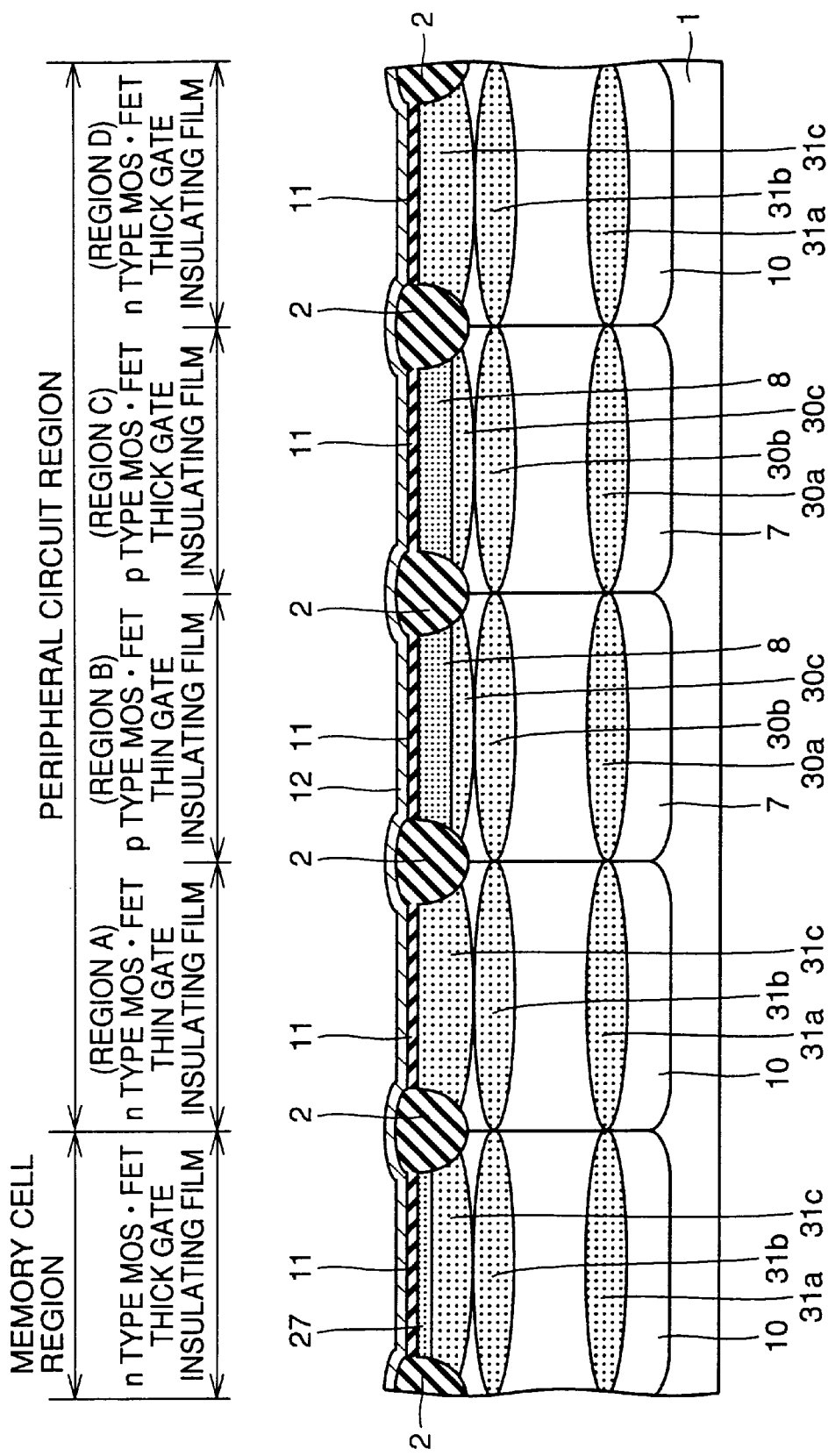

As shown in FIG. 6, a silicon oxide film 11 is then formed on the main surface of semiconductor substrate 1 to be a first gate insulating film. This silicon oxide film 11 has a thickness of 6 to 8 nm. Formed thereafter on silicon oxide film 11 and field oxide film 2 is a conductive, relatively thin polysilicon film 12.

Figure 7:
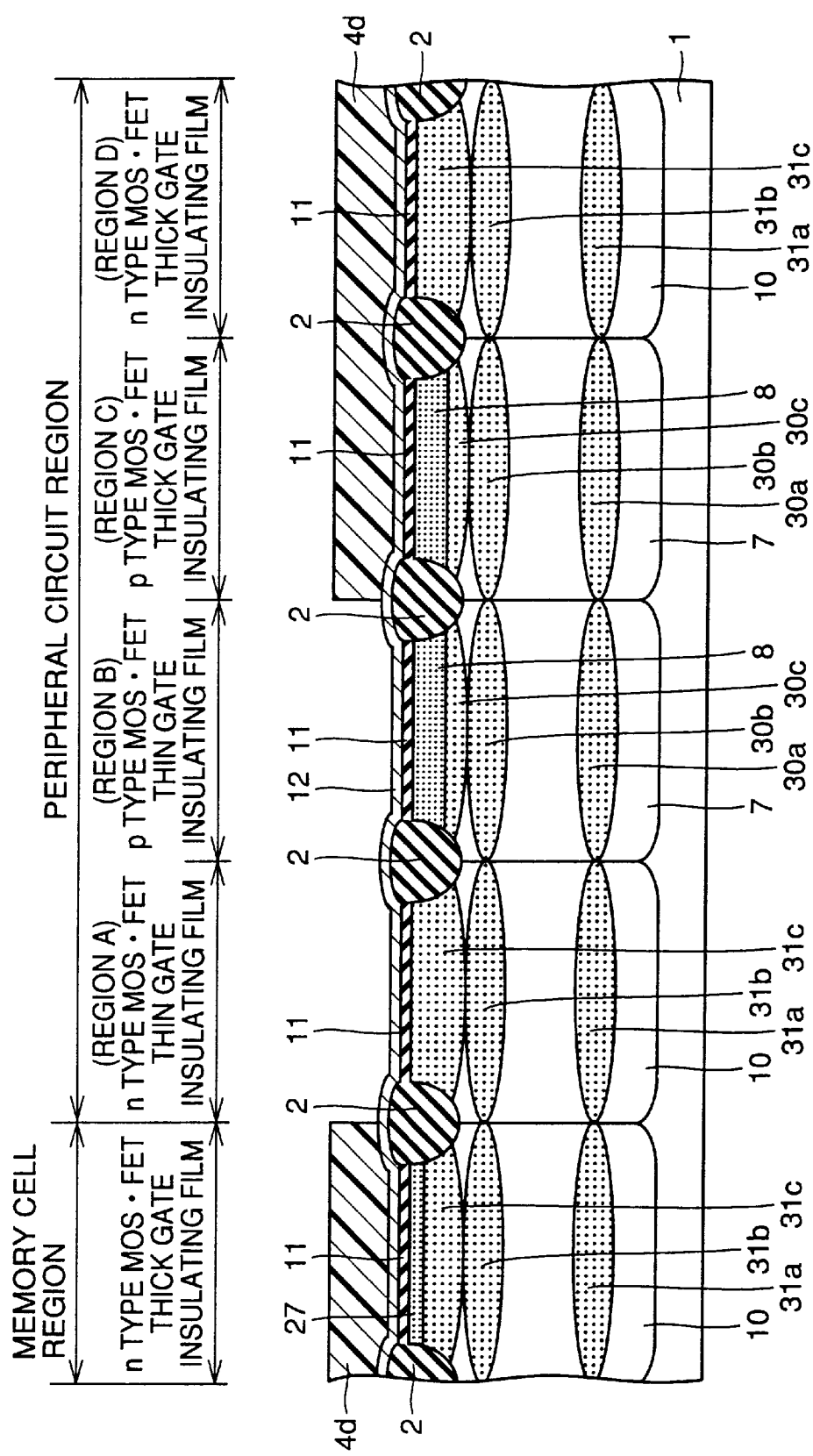

Next, as shown in FIG. 7, a resist pattern 4d is formed on polysilicon film 12 in the regions except for the regions A and B, where an n type FET and a p type FET are to be formed respectively. Using this resist pattern 4d as a mask, polysilicon film 12 and silicon oxide film 11 are removed in regions A and B by anisotropic etching, and then resist pattern 4d is removed.

Note that, instead of the resist pattern 4d, a silicon oxide film or the like may be deposited on polysilicon film 12 for use as a mask.

Figure 8:
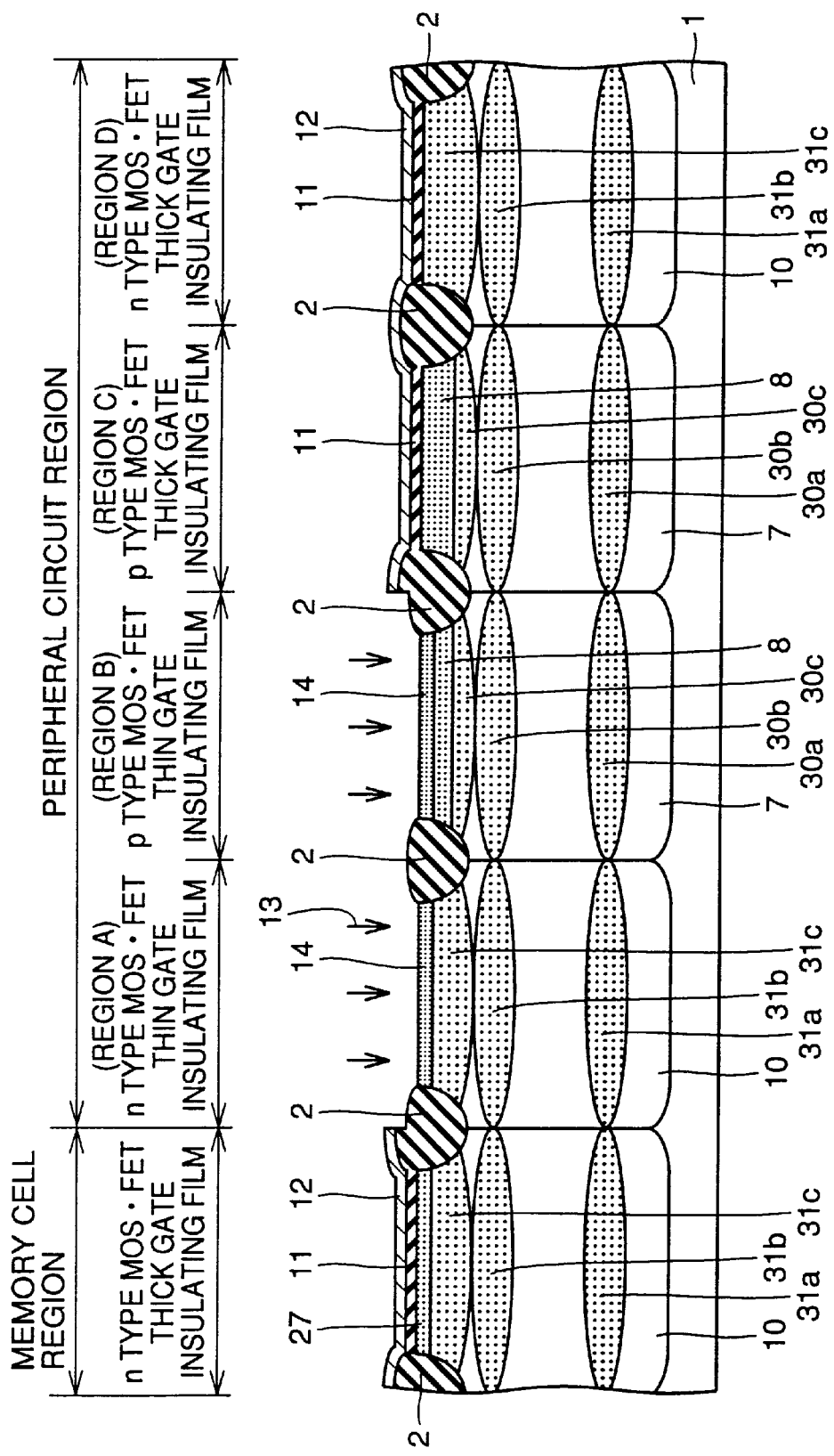

As shown in FIG. 8, a p type impurity 13, boron for example, is implanted into semiconductor substrate 1 located in regions A and B, using polysilicon film 12 as a mask. Here, boron is implanted using low energy of 5 to 20 keV, in a dose of the order of $1.0 \times 10^{12}$ to $1.0 \times 10^{13}/cm^2$. By this implantation, a second p type impurity region 14 of high concentration is formed.

Since the step of forming a silicon oxide film 15 (see FIG. 12) to be a second gate insulating film can be continuously performed using polysilicon film 12 as a mask for implantation of p type impurity 13, a conventionally required step of forming a resist pattern to mask the regions except for regions A and B when implanting the p type impurity is no longer needed. As a result, the manufacturing process for a semiconductor memory device can be simplified compared to the conventional one.

In addition, since p type impurity 13 is implanted, the impurity concentration in the vicinity of the surface of semiconductor substrate 1 in regions A and B can be changed, so that the impurity concentration at the channel region of an FET formed on the surface of semiconductor substrate 1 can be adjusted. Accordingly, the threshold voltage of the FET can readily be modified.

Figure 9:
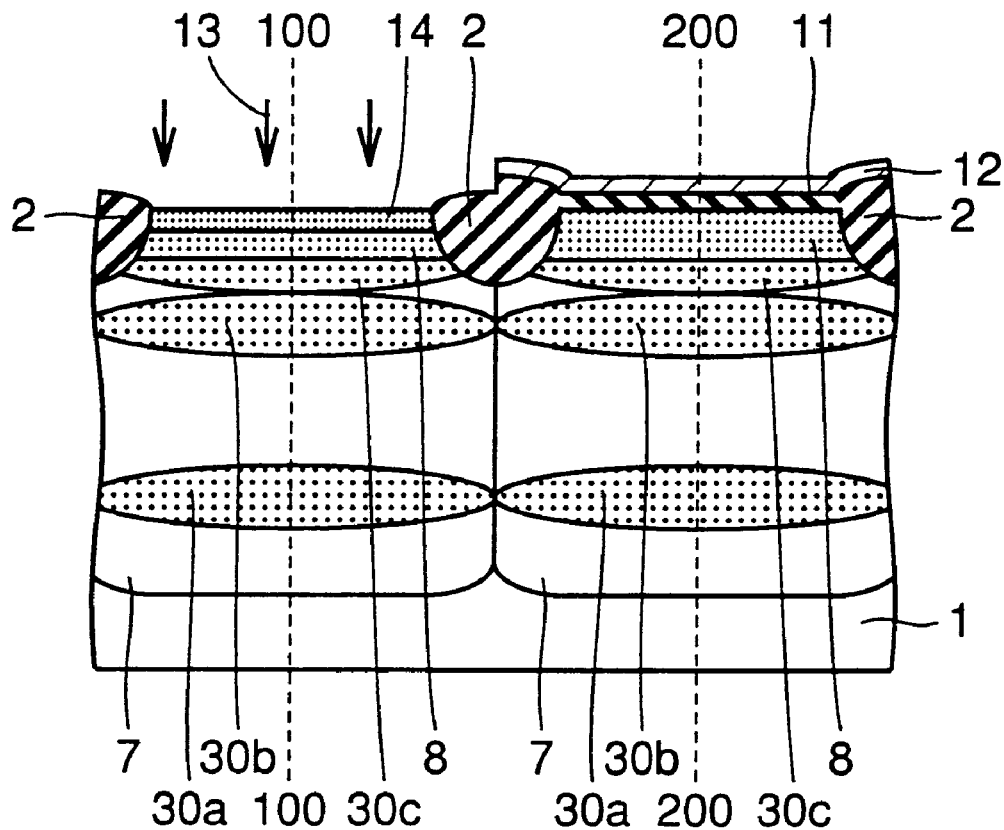
FIG. 9 is an enlarged view of the regions B and C in the cross section view of the semiconductor device shown in FIG. 8.

FIG. 9 is an enlarged view of regions B and C in FIG. 8. As shown in FIG. 9, since polysilicon film 12 in region C functions as a mask, p type impurity 13 is not implanted into semiconductor substrate 1. Therefore in region C, a second p type impurity buried region is not formed as in region B. The resulting distribution of the impurity concentration with respect to the depth of the semiconductor substrate in regions B and C are shown in FIGS. 10 and 11, respectively.

Figure 10:
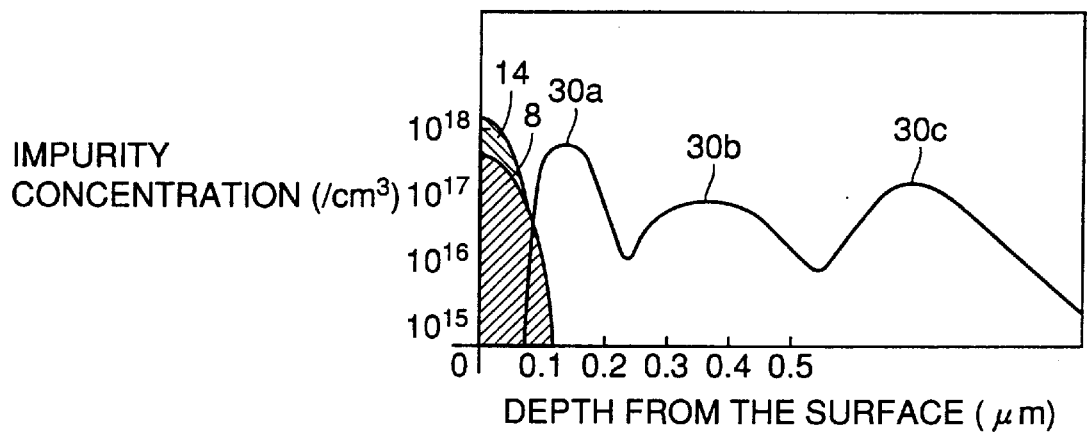
FIG. 10 is a graph showing a relation between the impurity concentration and the depth from the surface of the semiconductor substrate at the cross section taken along the line 100—100 in the region B shown in FIG. 9.
Figure 11:
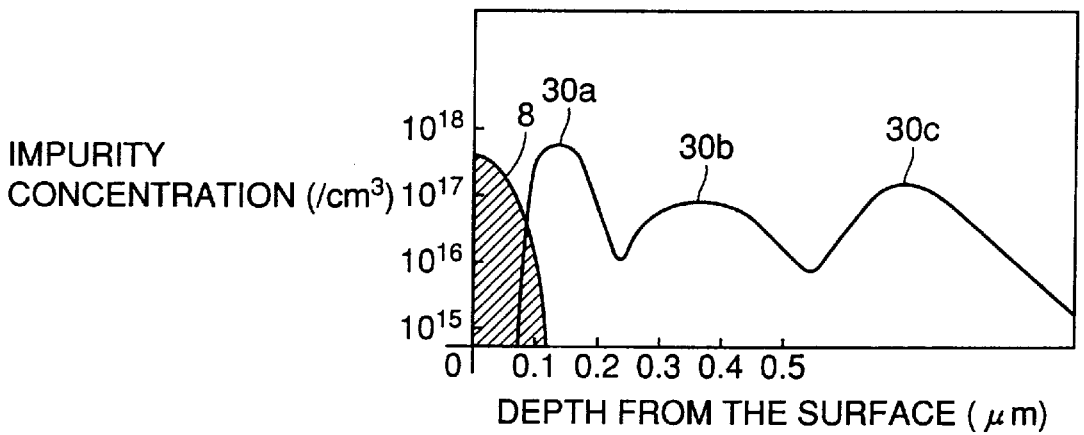
FIG. 11 is a graph showing a relation between the impurity concentration and the depth from the surface of the semiconductor substrate at the cross section taken along the line 200—200 in the region C shown in FIG. 9.

Referring to FIG. 10, in region B, second p type impurity region 14 of high concentration has been formed by implanting p type impurity 13 in the vicinity of the surface of semiconductor substrate 1 (see FIG. 9). Accordingly, the concentration of the p type impurity in the vicinity of the surface of semiconductor substrate 1 is greater in region B than in region C shown in FIG. 11.

This is because the energy for implanting the p type impurity, or boron, is made relatively low, for example from 5 to 20 keV, and thereby making small the implanting depth of the boron into semiconductor substrate 1. The impurity concentration at the channel region of an FET formed on the surface of semiconductor substrate 1 in region B can thus be effectively adjusted, and therefore, the threshold voltage of the FET can readily be modified.

Figure 12:
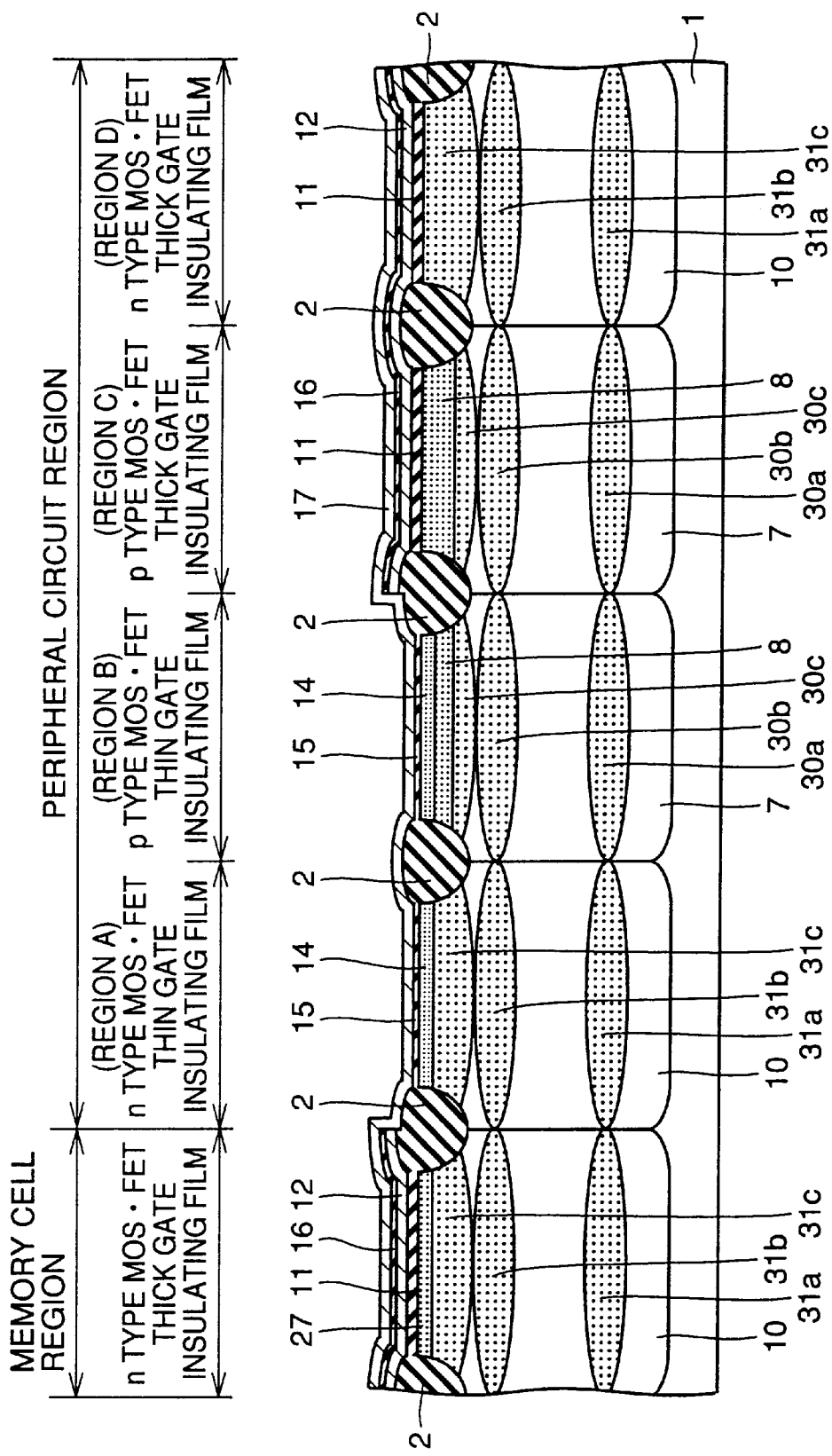
FIGS. 12 to 16 are cross sectional views illustrating the ninth to thirteenth steps in the process of manufacturing a semiconductor device according to the first embodiment of the present invention.

After the step shown in FIG. 8, silicon oxide films 15 and 16 to be a second gate insulating film are formed, as shown in FIG. 12, on the main surface of semiconductor substrate 1 and on polysilicon film 12, respectively, with a film thickness of 2 to 4 nm. A relatively thin polysilicon film 17 as a conductive film is then formed on silicon oxide films 15 and 16.

Figure 13:
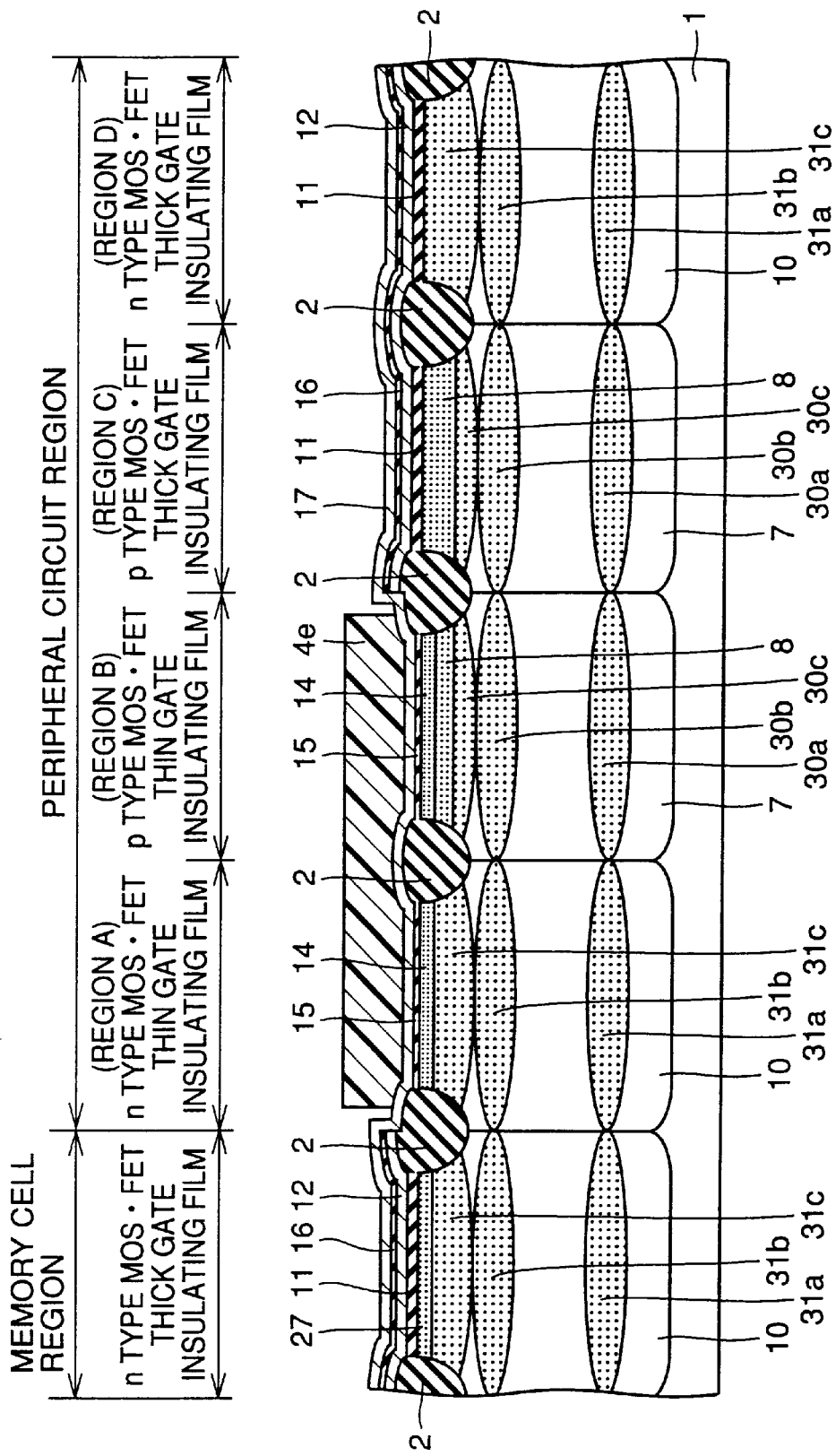

Next, a resist pattern 4e is formed on polysilicon film 17 in regions A and B, as shown in FIG. 13.

Figure 14:
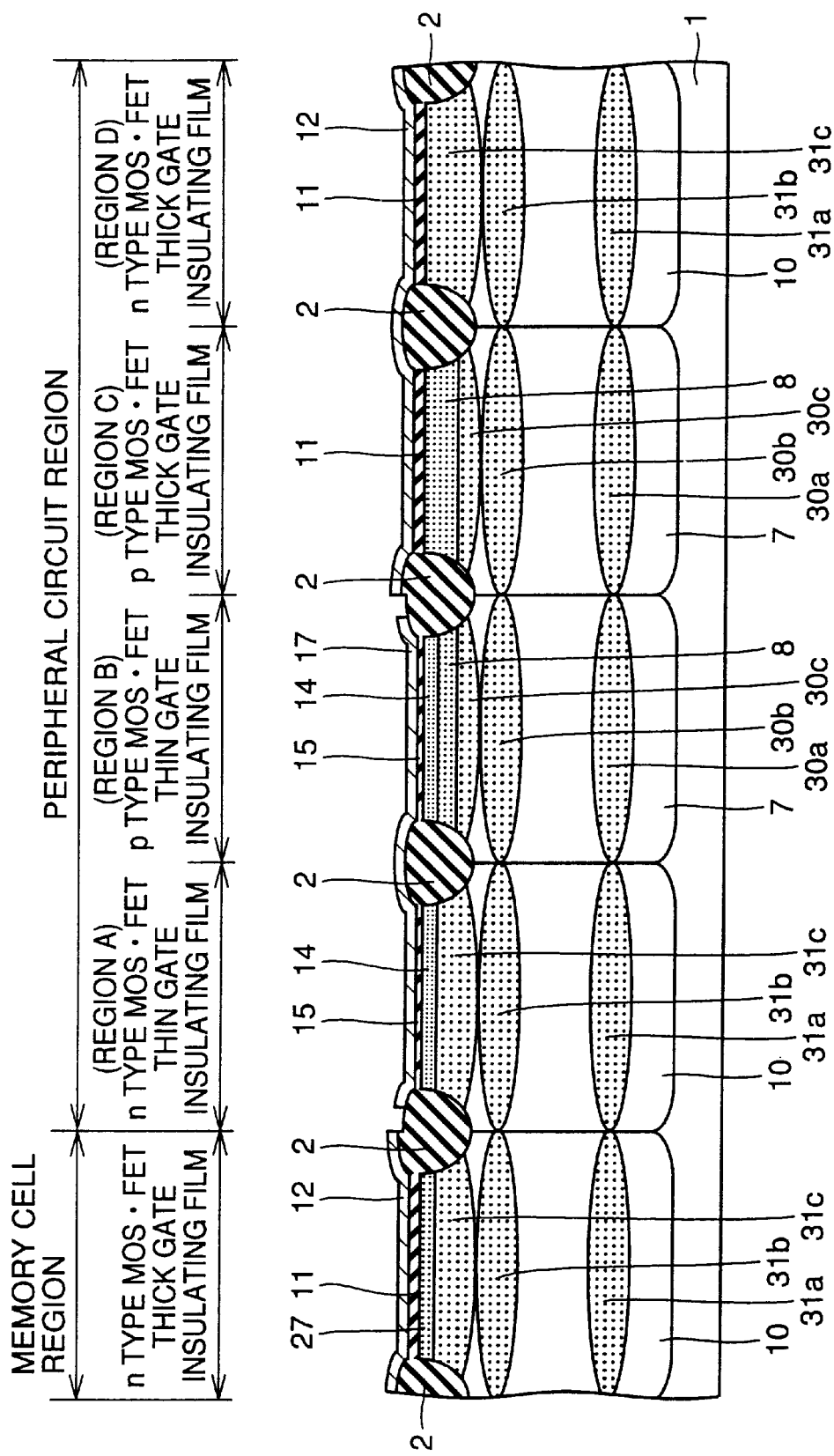

Using the resist pattern 4e as a mask, polysilicon film 17 and silicon oxide film 16 located in the regions other than regions A and B are etched away. Removing resist pattern 4e thereafter, the structure as shown in FIG. 14 is obtained.

Figure 15:
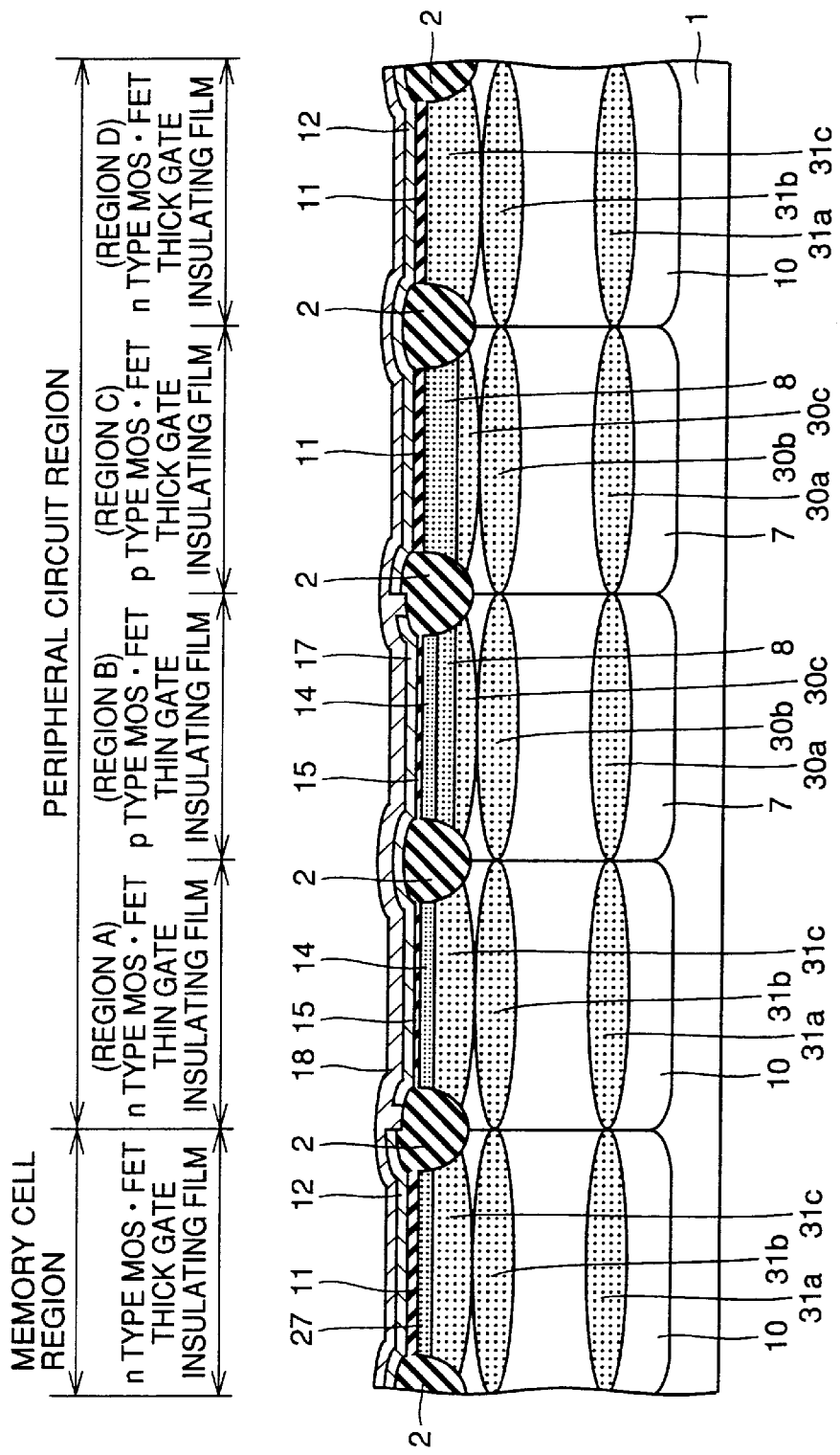

Next, as shown in FIG. 15, a polysilicon film 18 is formed on polysilicon films 12, 17. Here, instead of polysilicon film 18, there may be formed a film made of a material such as polycide or metal, or a composite film made of such a film and a polysilicon film. This polysilicon film 18 need not be formed in some cases.

Figure 16:
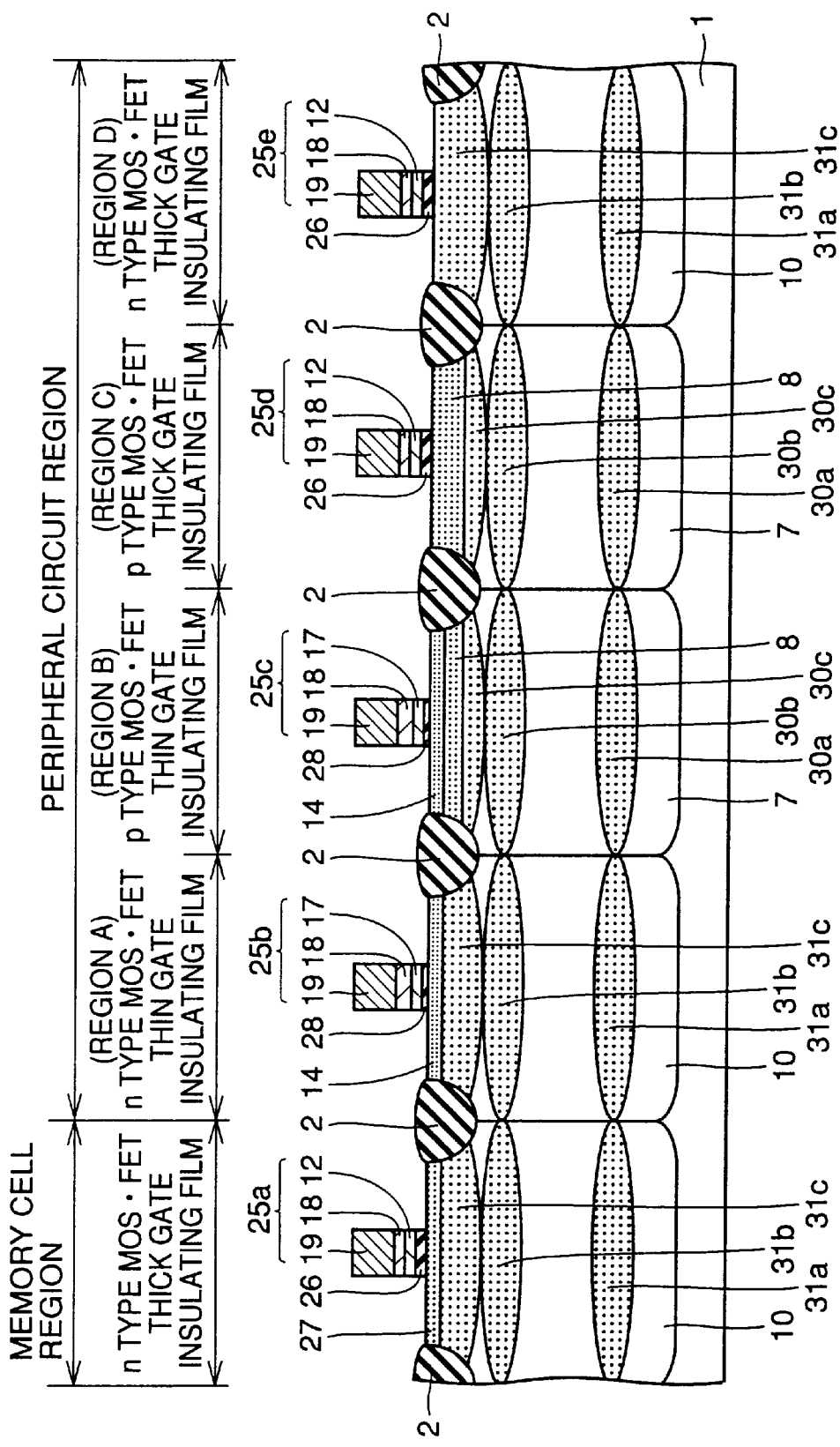

A conductive film 19 (see FIG. 16) is then formed on polysilicon film 18 (conductive film 19 need not be formed in some cases). A resist pattern (not shown) is formed on conductive film 19, and using this resist pattern as a mask, conductive film 19, polysilicon films 12, 17, 18, and silicon oxide films 11, 15 (see FIG. 15) are partly removed by anisotropic etching to form gate electrodes 25a–25e of FETs and gate insulating films 26, 28 (see FIG. 16). By removing the resist pattern thereafter, the structure shown in FIG. 16 is realized. Here,-gate electrodes 25a–25e and gate insulating films 26, 28 may be formed by making a resist pattern on polysilicon film 18 rather than by forming conductive film 19.

Thereafter formed in a manner similar to that of a conventional process for manufacturing a semiconductor memory device are: an insulating film to cover gate electrodes 25a–25e, the source/drain regions of those FETs, and aluminum interconnections and other elements. A semiconductor memory device is thus completed.

Now, a relation between the implanted amount of boron as p type impurity 13 shown in FIG. 8 and the threshold voltage of an FET will be explained with reference to FIG. 17. This p type FET has a gate length set at 0.6 μm.

Figure 17:
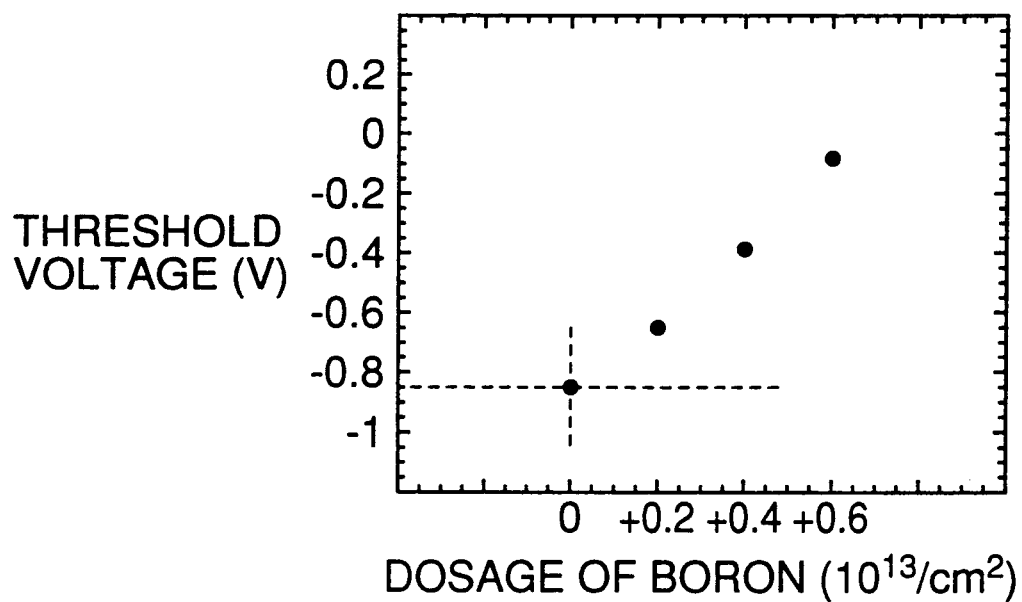
FIG. 17 is a graph showing a relation between the dosage of boron and the threshold voltage of an FET in the process shown in FIG. 8.

Referring to FIG. 17, without boron as a p type impurity 13 (see FIG. 8) being implanted, the threshold voltage of the FET is about –0.8V. When boron is additionally implanted at the acceleration voltage of 5 keV in a dose of $2.0 \times 10^{12}/$ $cm^2$, the threshold voltage becomes about −0.6V. With the dose of the order of $5.0×10^{12}$, the threshold voltage reads about −0.2V. Thus, by reducing the absolute value of the threshold voltage, a larger amount of drain current can be obtained with a low voltage. Furthermore, the film thickness of gate insulating film 28 (see FIG. 16) of the p type FET formed in region B is made as thin as 2 to 4 nm, whereby a still larger amount of drain current can be obtained. Accordingly, the performance of an FET in the peripheral circuit region, in particular its operating speed, can be improved. As a result, a semiconductor element in the peripheral circuit region, and hence a semiconductor memory device such as a DRAM, are permitted to operate at higher speed.

As described above, in this embodiment of the present invention, the threshold voltage of an FET is adjusted by forming thin gate insulating films in regions A and B in which n type and p type FETs are to be formed respectively, and by ion implanting a p type impurity 13 at relatively low energy, as shown in FIG. 8. However, this step of implanting the impurity so as to change the threshold voltage may be performed only in the region in which an n type FET is to be formed, or similarly, only in the region in which a p type FET is to be formed. In both cases, the same effects can be obtained.

In addition, instead of the currently used buried channel type of p type FET, a surface channel type element may be used to obtain the same effect.

Second Embodiment

Hereinafter, the process for manufacturing a semiconductor memory device according to the second embodiment of the present invention will be described with reference to FIG. 18.

Figure 18:
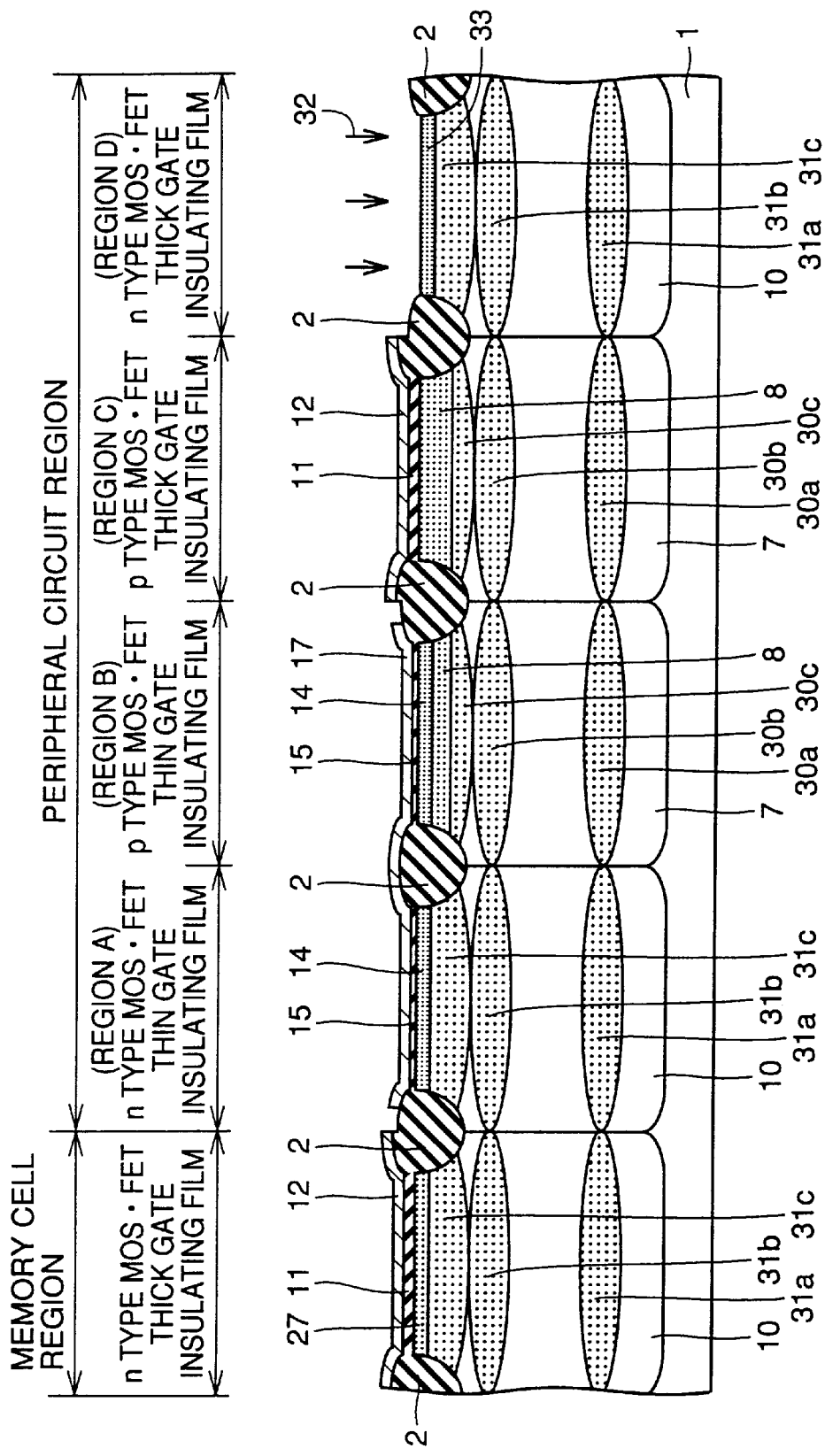
FIG. 18 is a cross sectional view showing the process of manufacturing a semiconductor device according to a second embodiment of the present invention.

After performing the manufacturing process for a semiconductor memory device according to the first embodiment of the present invention as shown in FIGS. 1–8 and 12–14, a resist pattern (not shown) is first formed in the regions except for the region D (see FIG. 18). Using this resist pattern as a mask, silicon oxide film 11 (see FIG. 14) and polysilicon film 12 (see FIG. 14) are removed in region D. Thereafter, the resist pattern is removed.

Using polysilicon films 12, 17 as a mask, as shown in FIG. 18, an n type impurity 32 is ion implanted into semiconductor substrate 1 in region D, to form an n type impurity region 33.

Next formed in region D is an oxide film (not shown) having a film thickness different from those of silicon oxide films 11, 15. Thereafter, a gate electrode and source/drain regions are formed with a process as explained in the first embodiment, and thus a semiconductor memory device is completed.

As described above, when an FET having a gate insulating film with a film thickness different from those of silicon oxide films 11 and 15 is formed in region D, similarly to the step as shown in FIG. 8, polysilicon films 12, 17 formed in the regions except for region D can be used as a mask when implanting an n type impurity 32 into semiconductor substrate 1, to form n type impurity region 33. A conventionally required step of forming a resist pattern to form n type impurity region 33 is thus no longer necessary. Therefore, even when forming gate insulating films having three different film thicknesses on a single semiconductor substrate, the process for manufacturing a semiconductor memory device can still be simplified as in the case of the first embodiment of the present invention.

Third Embodiment

In the process for manufacturing a semiconductor memory device according to the third embodiment of the present invention, after performing the steps of manufacturing a semiconductor memory device according to the first embodiment as shown in FIGS. 1 to 7, boron is implanted as a p type impurity 13 shown in FIG. 8 at the acceleration voltage of 20 to 50 keV.

Accordingly, the p type impurity region can be formed deeper from the surface of semiconductor substrate than in the case of implanting boron into semiconductor substrate 1 at the acceleration voltage less than 20 keV according to the first embodiment. Therefore, even when implanting boron as p type impurity 13 simultaneously into regions A and B within semiconductor substrate 1 in which n type and p type FETs are to be formed respectively, the concentration of boron as a p type impurity in the close vicinity of the main surface of semiconductor substrate 1 can be prevented from increasing. As a result, the threshold voltage of the n type FET formed in region A can be prevented from unnecessarily increasing.

At the same time, in region B, boron as p type impurity 13 cancels n type impurities existing in n type well 7 of semiconductor substrate 1. Accordingly, the effective concentration of the n type impurity in this region B can be decreased. As a result, in region B, the threshold voltage of the p type FET can be decreased to some extent.

Fourth Embodiment

With reference to FIGS. 19 to 23, the process for manufacturing a semiconductor memory device according to the fourth embodiment of the present invention will now be described.

Figure 19:
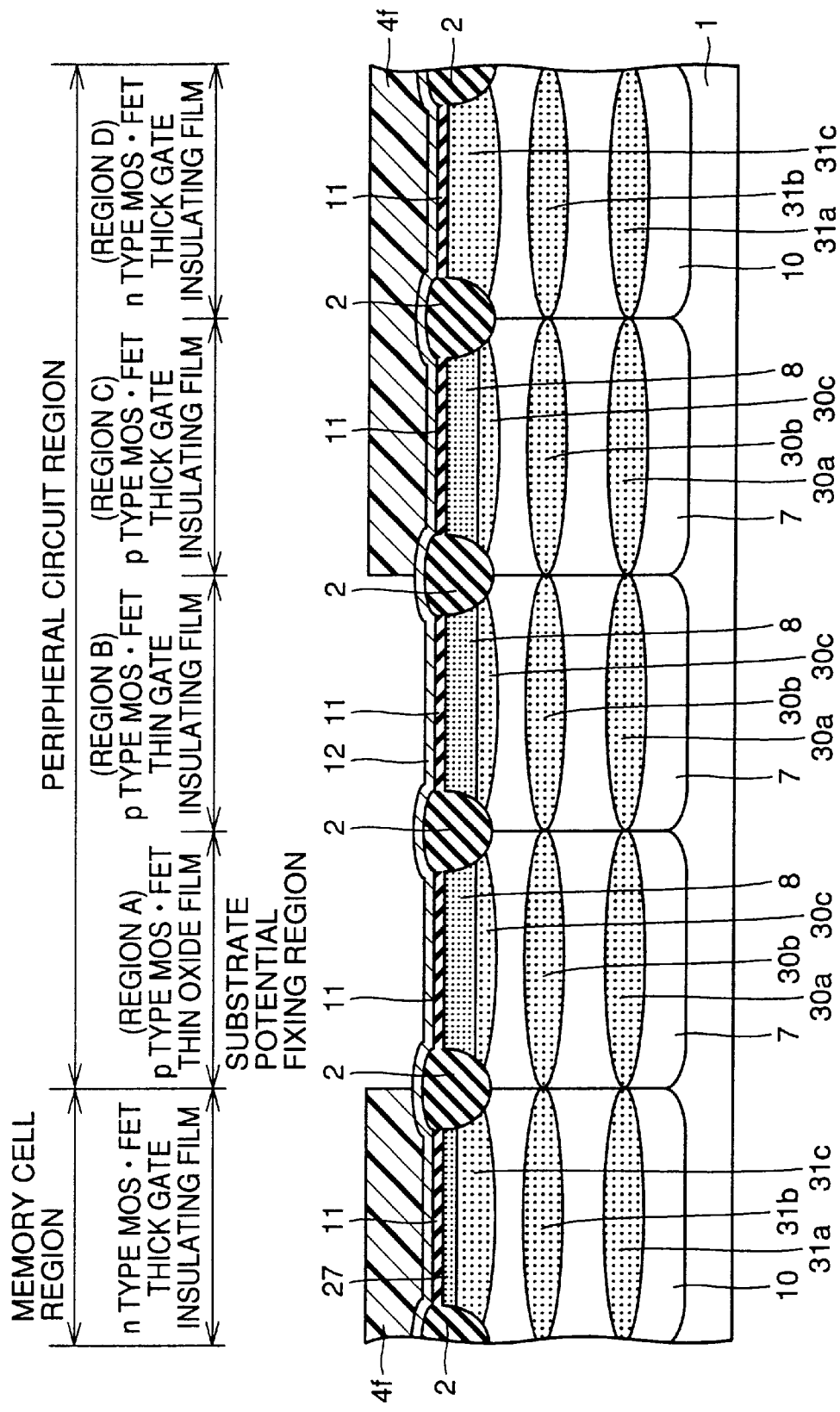
FIGS. 19 to 23 are cross sectional views illustrating the first to fifth steps in the process for manufacturing a semiconductor device according to a fourth embodiment of the present invention.

Firstly, the structure as shown in FIG. 19 is obtained by performing the manufacturing steps identical to those according to the first embodiment shown in FIGS. 1 to 7. Here, the semiconductor memory device according to the fourth embodiment has a structure fundamentally the same as that of the first embodiment as shown in FIG. 7. In the semiconductor memory device according to the fourth embodiment, however, n type wells 7 have been formed on semiconductor substrate 1 in regions A to C, and the region A is utilized as a region for fixing the substrate potential.

Figure 20:
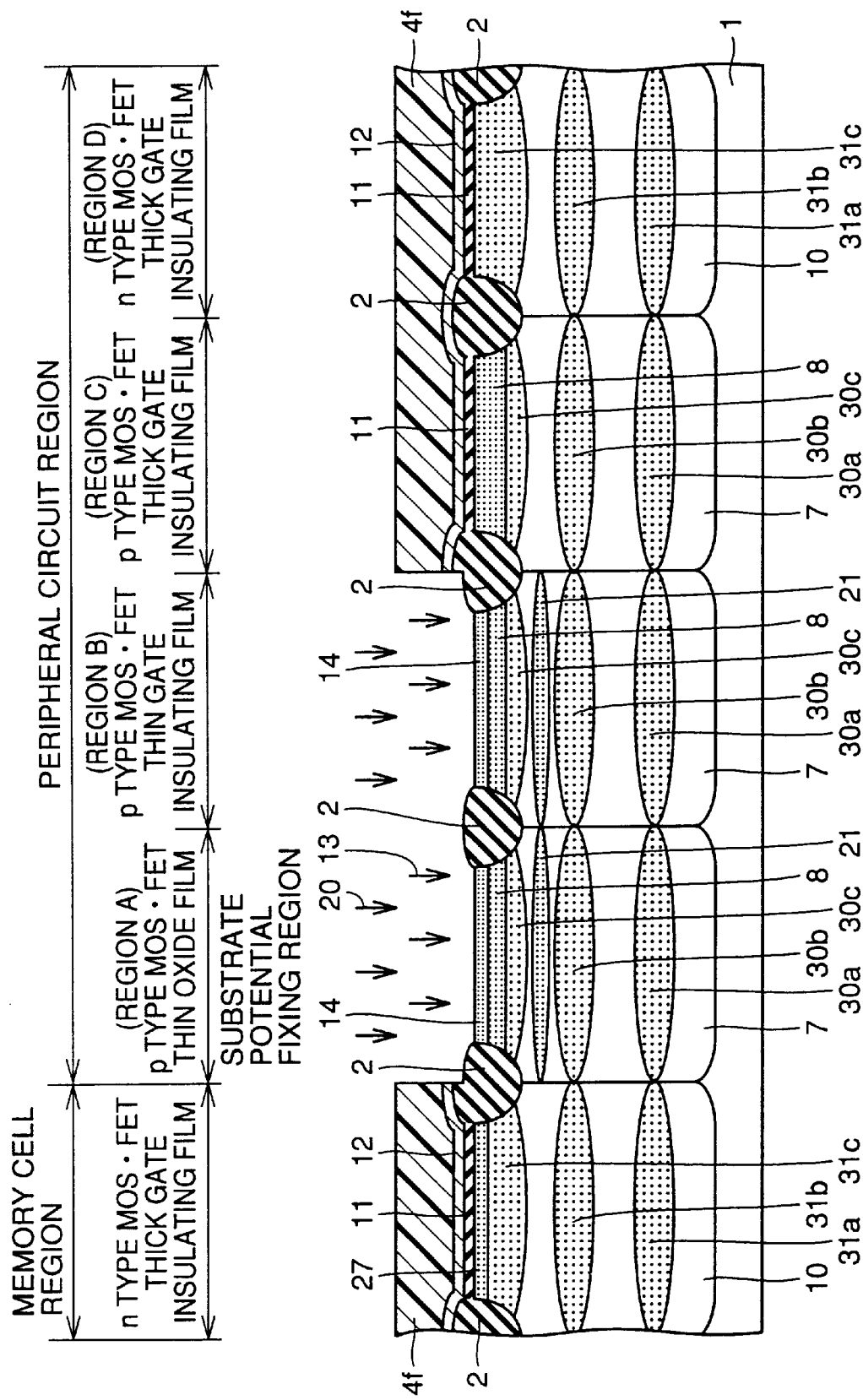

Next, as shown in FIG. 20, polysilicon film 12 and silicon oxide film 11 in regions A and B are removed using resist pattern 4f as a mask. Also using resist pattern 4f as masking, phosphorus or arsenic as an n type impurity 20 is ion implanted into semiconductor substrate 1, with medium energy at the acceleration voltage of 100 to 400 keV, and in a dose of $1.0×10^{12}$ to $1.0×10^{13}/cm^2$. By implanting phosphorus or arsenic in this manner, an n type impurity region 21 of relatively high concentration is formed in a region located at a depth of about 0.3 μm from the main surface of semiconductor substrate 1. At this time, energy from 200 to 400 keV is preferably employed as the acceleration voltage. Accordingly, n type impurity region 21 of phosphorus or arsenic can readily be positioned in a region about 0.3 μm deep from the main surface of semiconductor substrate 1.

Since relatively high concentration, n type impurity region 21 is formed as described above, when forming a p type FET in region B, a depletion layer surrounding the source or drain region of this p type FET can be prevented from spreading to a large extent. As a result, a distance between the source region or the drain region and each of the other elements can be reduced as compared to the prior art. (Specifically, the width of field oxide film 2 between regions A and B can be made narrower than a conventional one.) A larger scale integration of a semiconductor memory device is thus permitted.

In addition, by adjusting the acceleration voltage of this impurity, the depth of the region in which an n type impurity region 21 is to be formed can be adjusted so as to limit the spread of a depletion layer surrounding the source/drain regions to a small amount.

In the step as shown in FIG. 20, a p type impurity region 14 of high concentration may be formed by implanting a p type impurity 13 into regions A and B at relatively low energy.

Figure 21:
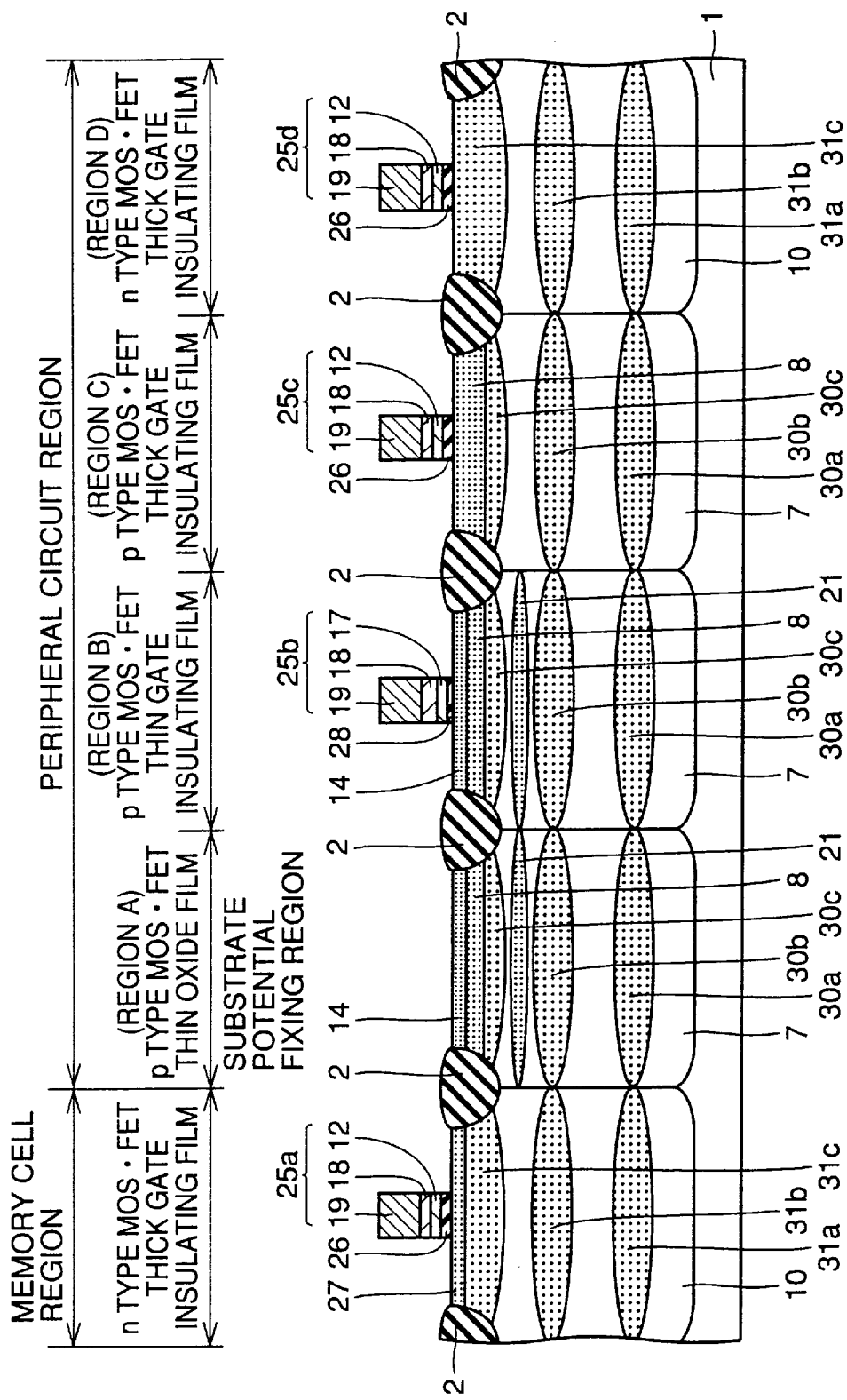

Next, as shown in FIG. 21, gate electrodes 25a to 25d and gate insulating films 26, 28 are formed by performing the steps of manufacturing a semiconductor memory device according to the first embodiment as shown in FIGS. 12 to 16. Here, a gate electrode or the like is not formed in region A, since it is utilized as a region for fixing the substrate potential.

It is understood that, after the step as shown in FIG. 20, an impurity may be additionally implanted only into region A by performing the same manufacturing steps of a semiconductor memory device according to the first embodiment as shown in FIGS. 6 to 8. Accordingly, the otherwise required step of forming a resist pattern when implanting an impurity only into region A becomes unnecessary.

Furthermore, an FET may be formed in region A.

Figure 22:
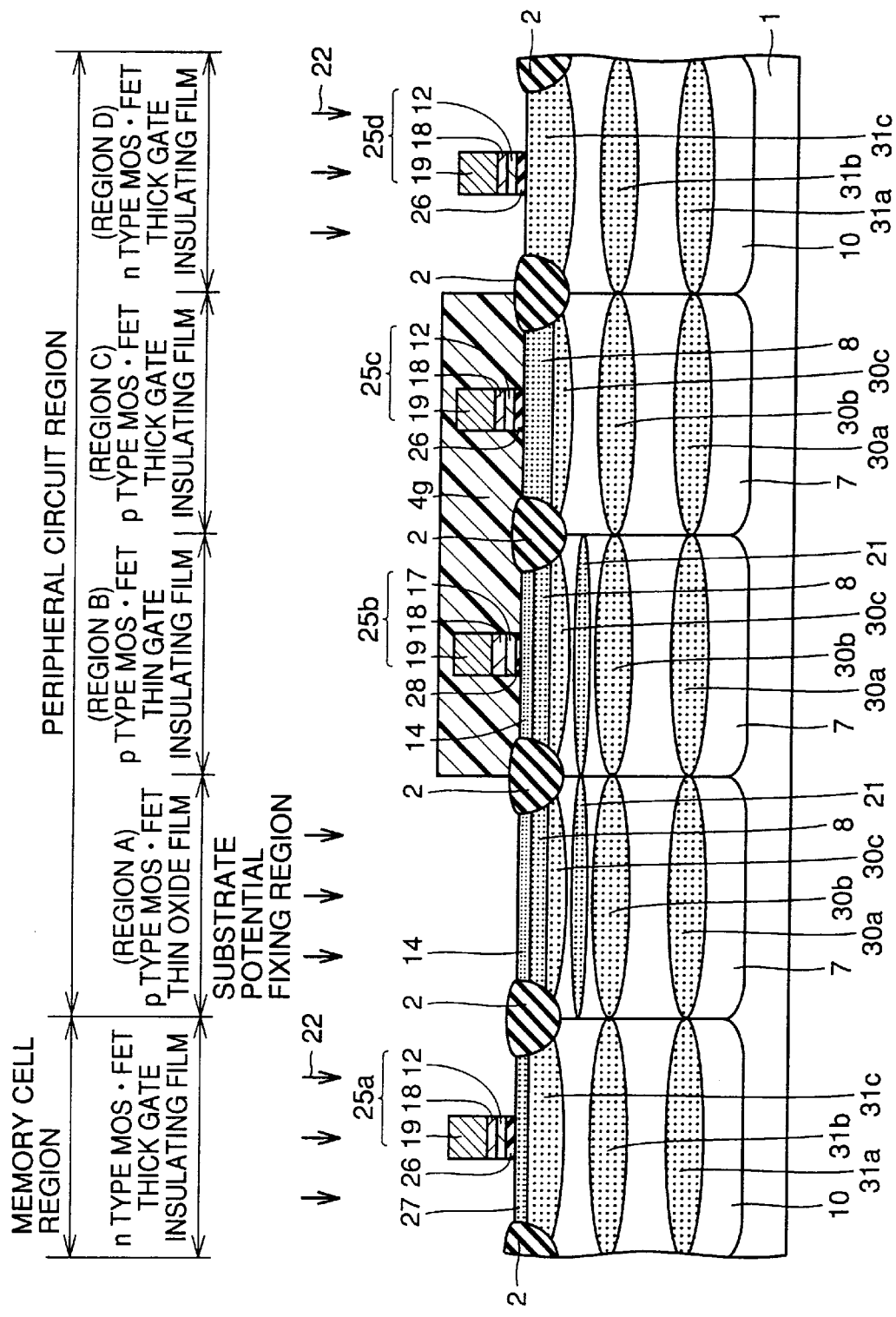
Figure 23:
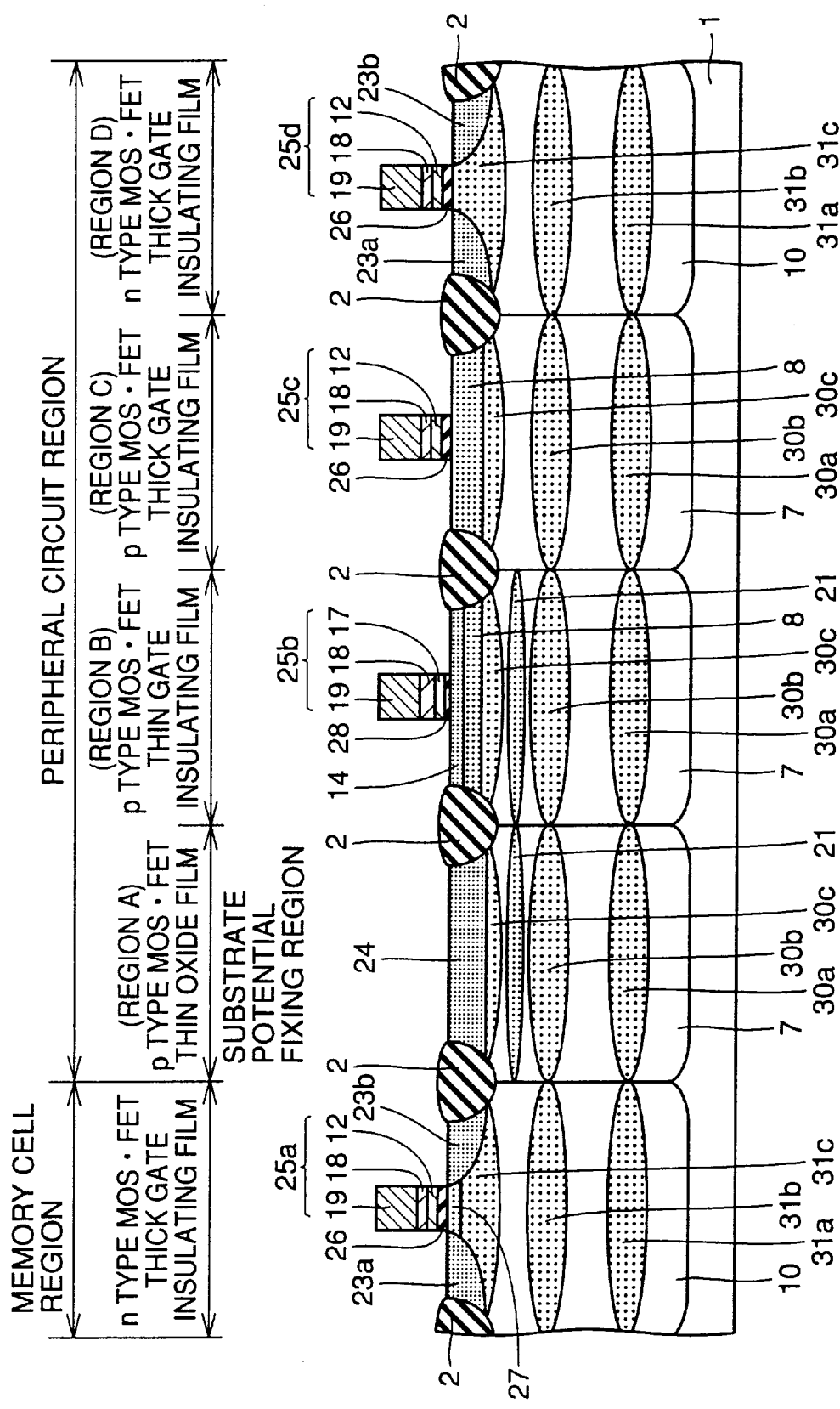
Figure 24:
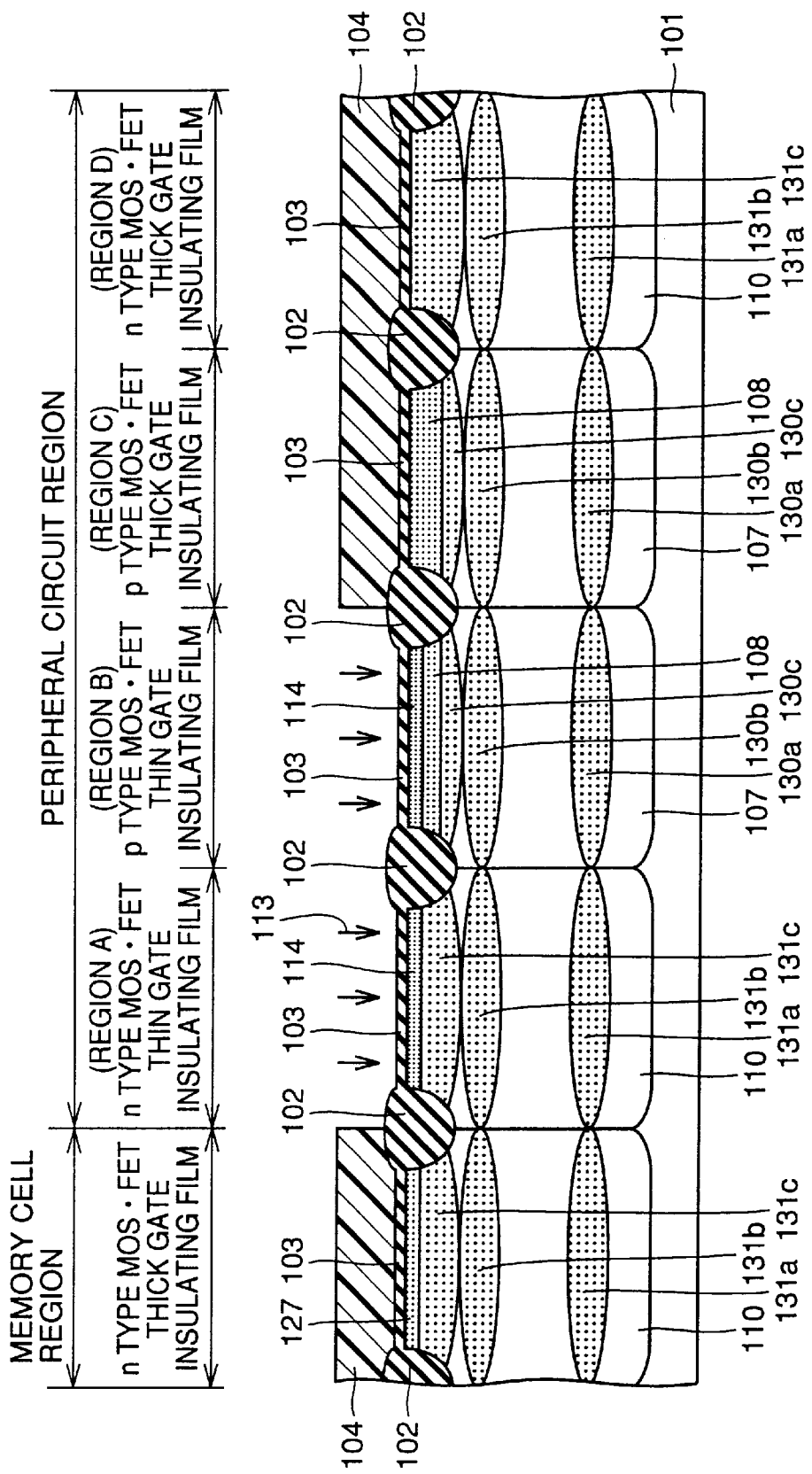
FIGS. 24 and 25 are cross sectional views illustrating the first and second steps in the conventional manufacturing process for a semiconductor device.
Figure 25:
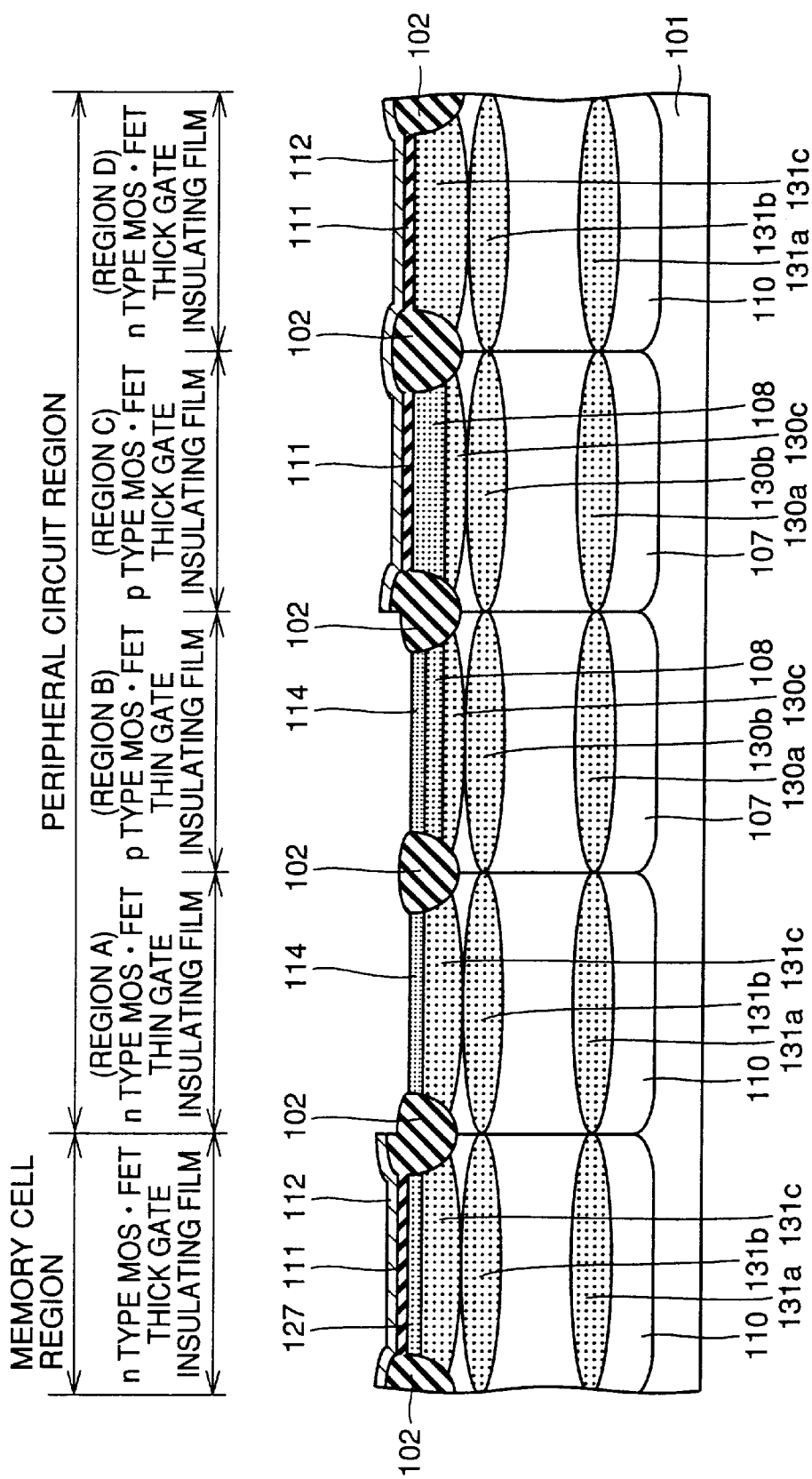

Thereafter, as shown in FIG. 22, a resist pattern 4g is formed on the main surface of semiconductor substrate 1 and on gate electrodes 25b, 25c in regions B and C. Using this resist pattern 4g as a mask, phosphorus or arsenic as an n type impurity 22 is ion implanted into semiconductor substrate 1 in the memory cell region and in regions A and D, whereby source/drain regions 23a, 23b (see FIG. 23) of the n type FETs as well as n type impurity region 24 (see FIG. 23) of high concentration in region A for fixing the substrate potential are formed.

Thereafter, steps of forming insulating films for protecting the source/drain regions of the p type FETs and gate electrodes 25a to 25d, and forming the aluminum interconnections are performed, which are similar to those for the first embodiment.

Note that formation of n type impurity region 21 as shown in FIG. 20 enables the distance between region A and the source or drain region of the p type FET formed in region B (or the width of field oxide film 2 between regions A and B) to be made as short as about 0.5 μm, which was conventionally 1 to 2 μm.

Further, in the manufacturing process of a semiconductor memory device according to the fourth embodiment, in the region in which a p type FET is to be formed (region B), the gate insulating film 28 (see FIG. 23) of the p type FET is made relatively thin, and the n type impurity region 21 (see FIG. 23) is formed in a self alignment manner. This can be applied to the region in which an n type FET is to be formed, and the same effects can be obtained.

In addition, by forming n type impurity regions 21 as described above, miniaturization as well as larger scale integration of semiconductor elements including FETs are permitted, making this invention highly effective for a semiconductor memory device for which such miniaturization and large scale integration are highly demanded.

In FIG. 20, instead of forming resist pattern 4f in the memory cell region, phosphorus or arsenic as an n type impurity 20 may also be implanted into semiconductor substrate 1 in the memory cell region, to form an n type impurity region at a depth of about 0.3 μm from the main surface of semiconductor substrate 1.

Accordingly, in the memory cell region, in the region about 0.3 μm deep from the surface of semiconductor substrate 1, the implanted n type impurity cancels p type impurities which had been existing prior to the implantation of the n type impurity, and thus the concentration of the p type impurity is decreased. Consequently, when forming an n type FET in the memory cell region, the electric field between the source/drain regions of the FET and semiconductor substrate 1 can be relaxed. Meanwhile, while in region B in the peripheral circuit region, formation of the impurity region 21 as described above enables miniaturization and large scale integration of a semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor device comprising the steps of:

forming a first gate insulating film on a semiconductor substrate having regions where first and second field effect transistors are to be formed respectively;

forming a first protection film on said first gate insulating film, in which the first protection film is a part of a gate electrode of the first field effect transistor;

removing said first gate insulating film and said first protection film from the region where said second field effect transistor is to be formed to expose the surface of said semiconductor substrate, while leaving said first protection film in the region where said first field effect transistor is to be formed; and, using said first protection film as a mask, introducing an impurity into said semiconductor substrate in the region where said second field effect transistor is to be formed.

2. The method for manufacturing a semiconductor device according to claim 1, wherein the region where said second field effect transistor is to be formed includes regions where third and fourth field effect transistors are to be formed respectively, the method further comprising the steps of:

forming a second gate insulating film on said semiconductor substrate in the region where said second field effect transistor is to be formed;

forming a second protection film on said second gate insulating film;

removing said second gate insulating film and said second protection film in the region where said third field effect transistor is to be formed to expose the surface of said semiconductor substrate, while leaving said second protection film in the region where said fourth field effect transistor is to be formed; and, using said second protection film as a mask, implanting an impurity into said semiconductor substrate in the region where said third field effect transistor is to be formed.

3. The method for manufacturing a semiconductor device according to claim 1, wherein the step of implanting an impurity into said semiconductor substrate in the region where said second field effect transistor is to be formed includes a step of forming an impurity region in the vicinity of the surface of said semiconductor substrate.

4. The method for manufacturing a semiconductor device according to claim 1, wherein the step of implanting an impurity into said semiconductor substrate in the region where second field effect transistor is to be formed includes a step of forming an impurity region within said semiconductor substrate at a distance between 0.2 μm and 0.4 μm from the surface of said semiconductor substrate.

5. The method for manufacturing semiconductor device according to claim 1, wherein said semiconductor device is a semiconductor memory device, and said first and second field effect transistors are formed in the peripheral circuit region of said semiconductor memory device.

6. The method for manufacturing a semiconductor device according to claim 1, further comprising forming a second gate insulating film having a film thickness smaller than that of the first gate insulating film in the region where the second field effect transistor is to be formed.

* * * * *